US010505563B1

(12) United States Patent
Gonczi et al.

(10) Patent No.: US 10,505,563 B1
(45) Date of Patent: Dec. 10, 2019

(54) TECHNIQUES FOR OPTIMIZING ENTROPY COMPUTATIONS

(71) Applicant: EMC IP Holding Company LLC, Hopkinton, MA (US)

(72) Inventors: Istvan Gonczi, Berkley, MA (US); Ivan Bassov, Brookline, MA (US); Sorin Faibish, Newton, MA (US)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 16/171,863

(22) Filed: Oct. 26, 2018

(51) Int. Cl.
*H03M 7/40* (2006.01)
*H03M 7/30* (2006.01)
*H03M 7/42* (2006.01)

(52) U.S. Cl.
CPC ....... *H03M 7/6011* (2013.01); *H03M 7/3095* (2013.01); *H03M 7/4031* (2013.01); *H03M 7/42* (2013.01)

(58) Field of Classification Search
CPC .............................. H03M 7/6011; H03M 7/42
USPC ........................ 341/50, 51, 67, 106
See application file for complete search history.

(56) References Cited

U.S. PATENT DOCUMENTS

| 6,661,839 B1 * | 12/2003 | Ishida .............. G01R 31/31921 341/51 |
| 2008/0049542 A1 * | 2/2008 | Lee .......................... G11C 8/04 365/236 |
| 2019/0108215 A1 * | 4/2019 | Jaroch .................. G06F 17/277 |

OTHER PUBLICATIONS

Kedarnath J. Balakrishnan, "Relationship Between Entropy and Test Data Compression," IEEE Transactions on Computer-Aided Design of Integrated Circuits and Systems, vol. 26, No. 2, Feb. 2007.
Wikipedia, "Entropy (information theory)," https://en.wikipedia.org/wiki/Entropy_(information_theory), Sep. 9, 2018.
ForensickB, "Computer Forensics, Malware Analysis & Digital Investigations," http://www.forensickb.com/2013/03/file-entropy-explained.html, Mar. 20, 2013.
Werner Ebeling, et al., "Entropy and Compressibility of Symbol Sequences," PhysComp96, Institute of Physics, Humboldt University, Feb. 23, 1997.

* cited by examiner

*Primary Examiner* — Peguy Jean Pierre
(74) *Attorney, Agent, or Firm* — Muirhead and Saturnelli, LLC

(57) ABSTRACT

Techniques for data processing may include: determining a data layout for a configuration of counters stored in registers, wherein each of the registers is configured to store at least two counters, and each counter is associated with a particular data item allowable in the data set and denotes a current frequency of the particular data item; receiving data items of a data chunk of the data set; for each data item received, performing processing including: determining a first of the counters corresponding to the data item, wherein the first counter is stored in a first of the registers and denotes a current frequency of the data item; and incrementing the first counter stored in the first register by one; and determining, in accordance with the counters stored in the registers, an entropy value for the data chunk.

20 Claims, 12 Drawing Sheets

TECHNIQUES FOR OPTIMIZING ENTROPY COMPUTATIONS

BACKGROUND

Technical Field

This application generally relates to performing computations and, in particular, optimizing computations performed to improve performance.

Description of Related Art

Systems may include different resources used by one or more host processors. Resources and host processors in the system may be interconnected by one or more communication connections, such as network connections. These resources may include, for example, data storage devices such as those included in the data storage systems manufactured by Dell Inc. These data storage systems may be coupled to one or more host processors and provide storage services to each host processor. Multiple data storage systems from one or more different vendors may be connected and may provide common data storage for one or more host processors in a computer system.

A host may perform a variety of data processing tasks and operations using the data storage system. For example, a host may issue I/O operations, such as data read and write operations, received at a data storage system. Host systems may store and retrieve data by issuing the I/O operations to the data storage system containing a plurality of host interface units, disk drives (or more generally storage devices), and disk interface units. The host systems access the storage devices through a plurality of channels provided therewith. Host systems provide data and access control information through the channels to a storage device of the data storage system and data of the storage device is also provided from the data storage system to the host systems also through the channels. The host systems do not address the disk drives of the data storage system directly, but rather, access what appears to the host systems as a plurality of files, objects, logical units, logical devices or logical volumes. Thus, the I/O operations issued by the host may be directed to a particular storage entity, such as a file or logical device. The logical devices may or may not correspond to the actual physical drives. Allowing multiple host systems to access the single data storage system allows the host systems to share data stored therein.

SUMMARY OF THE INVENTION

In accordance with one aspect of the techniques herein is a method of data processing comprising: determining a data layout for a configuration of a plurality of counters stored in a plurality of registers, wherein each of the plurality of registers is configured to store at least two of the plurality of counters, wherein a first portion of data items allowable in a data set are mapped to the plurality of counters, wherein each of the plurality of counters is associated with a particular data item of the first portion of data items allowable in the data set and denotes a current frequency of the particular data item; receiving a plurality of data items of a data chunk of the data set; for each data item of the plurality of data items, performing processing including: determining a first of the plurality of counters corresponding to said each data item, wherein the first counter is stored in a first of the plurality of registers and denotes a current frequency of said each data item in the first plurality of data items; and incrementing the first counter stored in the first register by one; and determining, in accordance with the plurality of counters stored in the plurality of registers, an entropy value for the data chunk. The plurality of counters may not be stored in memory and may only be stored in the plurality of registers. Each of the plurality of counters may be associated with a different data item of the first portion of data items allowable in the data set and each of the plurality of counters may be implemented as a data type having a size of a number of bits capable of representing a range of defined frequency values, wherein the range may include a maximum number of potential occurrences of the different data item allowable in the data chunk. A second plurality of counters may be stored in memory and associated with a second portion of data items allowable in the data set, and wherein each of the second plurality of counters may be associated with a particular data item of the second portion of data items allowable in the data set and may denote a current frequency of the particular data item. The method may include ranking an aggregate set of data items allowable in the data set, wherein said ranking is performed in accordance with probabilities that data items of the aggregate set are expected to occur in the data set, wherein said aggregate set includes the first portion of data items allowable in the data set and includes the second portion of data items allowable in the data set; selecting the first portion of data items allowable in the data set for storage in the plurality of registers, wherein the first portion of data items are ranked by said ranking as having highest associated probabilities of expected occurrence in the data set; and selecting the second portion of data items allowable in the data chunk for storage in memory, where the second portion of data items are ranked by said ranking as having associated probabilities of expected occurrence in the data set which are less than probabilities of expected occurrence in the data set associated with the first portion of data items allowable in the data set. The plurality of data items received may be data items processed in a single pass, wherein a number of data items in the plurality of data items may be selected in accordance with a maximum counter value representable by each of the plurality of counters stored in the plurality of registers. After performing the processing for the plurality of data items of the single pass, the method may include performing other processing including updating in-memory cumulative counter values for the data chunk in accordance with the plurality of counters stored in the plurality of registers, wherein each of the plurality of counters stored in one of the plurality of registers has a corresponding one of the in-memory cumulative counter values and said updating adds said each counter stored in the one register to the corresponding one of the in-memory cumulative counter values. The method may include receiving a second plurality of data items of the data chunk processed in a second single pass, wherein a number of data items in the second plurality of data items is selected in accordance with the maximum counter value representable by each of the plurality of counters stored in the plurality of registers. The method may include for each data item of the second plurality of data items, performing second processing including: determining one of the plurality of counters corresponding to said each data item, wherein the one counter is stored in a second of the plurality of registers and denotes a current frequency of said each data item in the second plurality of data items; and incrementing the one counter stored in the second register by one. The method may include updating the in-memory cumulative counter values for the data chunk in accordance with the plurality of counters stored in the plurality of registers after completing the second processing for the second plurality of data items, wherein said updating after completing the second processing adds the plurality of counters stored in the plurality of registers to corresponding ones of the in-memory cumulative counter values. Determining an entropy value for the data chunk may use the in-memory cumulative counter values for the data chunk. The entropy value for the data chunk may be determined inline as part of I/O path processing for the data chunk. The method may include determining, in accordance with the entropy value for the data chunk, whether to compress the data chunk. The method may include determining whether the entropy value for the data chunk is greater than an entropy threshold; responsive to determining that the entropy value for the data chunk is not greater than the entropy threshold, determining that the data chunk is uncompressible and not to compress the data chunk, wherein the data chunk is stored in its original uncompressed form; and responsive to determining that the entropy value for the data chunk is equal to or less than the entropy threshold, compressing the data chunk. Subsequent to compressing the data chunk, the method may include: determining whether a compressed form of the data chunk, as compared to an original uncompressed form of the data chunk, achieves at least a threshold level of data reduction; responsive to determining the compressed form of the data chunk achieves at least a threshold level of data reduction, determining the data chunk is compressible and storing the data chunk in the compressed form; and responsive to determining the compressed form of the data chunk does not achieve at least a threshold level of data reduction, determining the data chunk is uncompressible and storing the data chunk in its uncompressed form.

In accordance with another aspect of the techniques herein is a system comprising: a processor; and a memory comprising code stored thereon that, when executed, performs a method of data processing comprising: determining a data layout for a configuration of a plurality of counters stored in a plurality of registers, wherein each of the plurality of registers is configured to store at least two of the plurality of counters, wherein a first portion of data items allowable in a data set are mapped to the plurality of counters, wherein each of the plurality of counters is associated with a particular data item of the first portion of data items allowable in the data set and denotes a current frequency of the particular data item; receiving a plurality of data items of a data chunk of the data set; for each data item of the plurality of data items, performing processing including: determining a first of the plurality of counters corresponding to said each data item, wherein the first counter is stored in a first of the plurality of registers and denotes a current frequency of said each data item in the first plurality of data items; and incrementing the first counter stored in the first register by one; and determining, in accordance with the plurality of counters stored in the plurality of registers, an entropy value for the data chunk.

In accordance with another aspect of techniques herein is a computer readable medium comprising code stored thereon that, when executed, performs a method of data processing comprising: determining a data layout for a configuration of a plurality of counters stored in a plurality of registers, wherein each of the plurality of registers is configured to store at least two of the plurality of counters, wherein a first portion of data items allowable in a data set are mapped to the plurality of counters, wherein each of the plurality of counters is associated with a particular data item of the first portion of data items allowable in the data set and denotes a current frequency of the particular data item; receiving a plurality of data items of a data chunk of the data set; for each data item of the plurality of data items, performing processing including: determining a first of the plurality of counters corresponding to said each data item, wherein the first counter is stored in a first of the plurality of registers and denotes a current frequency of said each data item in the first plurality of data items; and incrementing the first counter stored in the first register by one; and determining, in accordance with the plurality of counters stored in the plurality of registers, an entropy value for the data chunk. The plurality of counters may not be stored in memory and may only be stored in the plurality of registers. Each of the plurality of counters may be associated with a different data item of the first portion of data items allowable in the data set and each of the plurality of counters may be implemented as a data type having a size of a number of bits capable of representing a range of defined frequency values, wherein the range may include a maximum number of potential occurrences of the different data item allowable in the data chunk. A second plurality of counters may be stored in memory and associated with a second portion of data items allowable in the data set, and wherein each of the second plurality of counters may be associated with a particular data item of the second portion of data items allowable in the data set and may denote a current frequency of the particular data item. The method may include ranking an aggregate set of data items allowable in the data set, wherein said ranking is performed in accordance with probabilities that data items of the aggregate set are expected to occur in the data set, wherein said aggregate set includes the first portion of data items allowable in the data set and includes the second portion of data items allowable in the data set; selecting the first portion of data items allowable in the data set for storage in the plurality of registers, wherein the first portion of data items are ranked by said ranking as having highest associated probabilities of expected occurrence in the data set; and selecting the second portion of data items allowable in the data chunk for storage in memory, where the second portion of data items are ranked by said ranking as having associated probabilities of expected occurrence in the data set which are less than probabilities of expected occurrence in the data set associated with the first portion of data items allowable in the data set.

BRIEF DESCRIPTION OF THE DRAWINGS

Features and advantages of the present invention will become more apparent from the following detailed description of exemplary embodiments thereof taken in conjunction with the accompanying drawings in which.

DETAILED DESCRIPTION OF EMBODIMENT(S)

Figure 1:
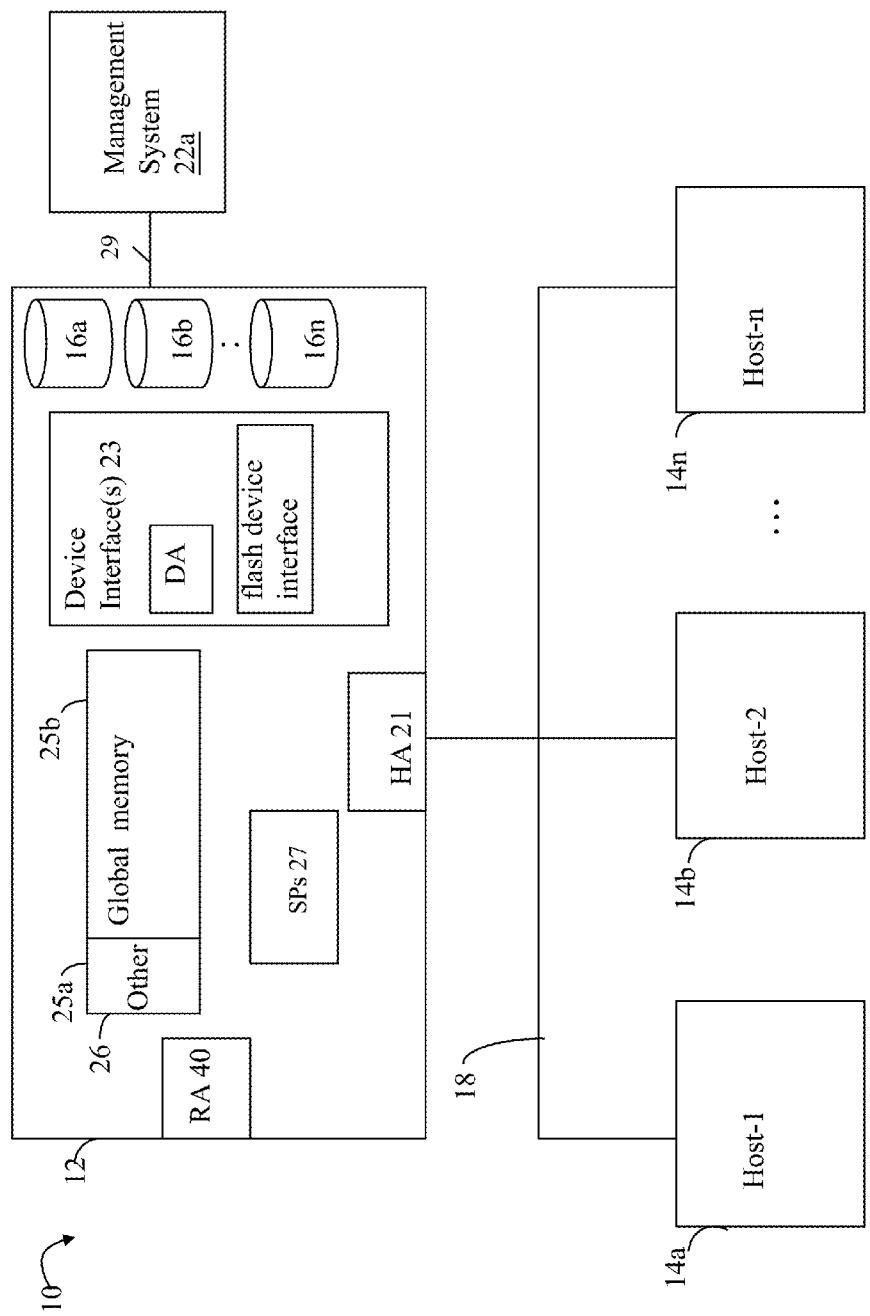
FIGS. 1 and 2B are examples of components that may be included in a system in accordance with techniques described herein.

Referring to FIG. 1, shown is an example of an embodiment of a system that may be used in connection with performing the techniques described herein. The system 10 includes a data storage system 12 connected to host systems 14a-14n through communication medium 18. In this embodiment of the computer system 10, and the n hosts 14a-14n may access the data storage system 12, for example, in performing input/output (I/O) operations or data requests. The communication medium 18 may be any one or more of a variety of networks or other type of communication connections as known to those skilled in the art. The communication medium 18 may be a network connection, bus, and/or other type of data link, such as a hardwire or other connections known in the art. For example, the communication medium 18 may be the Internet, an intranet, network (including a Storage Area Network (SAN)) or other wireless or other hardwired connection(s) by which the host systems 14a-14n may access and communicate with the data storage system 12, and may also communicate with other components included in the system 10.

Each of the host systems 14a-14n and the data storage system 12 included in the system 10 may be connected to the communication medium 18 by any one of a variety of connections as may be provided and supported in accordance with the type of communication medium 18. The processors included in the host computer systems 14a-14n may be any one of a variety of proprietary or commercially available single or multi-processor system, such as an Intel-based processor, or other type of commercially available processor able to support traffic in accordance with each particular embodiment and application.

It should be noted that the particular examples of the hardware and software that may be included in the data storage system 12 are described herein in more detail, and may vary with each particular embodiment. Each of the host computers 14a-14n and data storage system may all be located at the same physical site, or, alternatively, may also be located in different physical locations. Examples of the communication medium that may be used to provide the different types of connections between the host computer systems and the data storage system of the system 10 may use a variety of different communication protocols such as block-based protocols (e.g., SCSI, Fibre Channel, iSCSI), file system-based protocols (e.g., NFS), and the like. Some or all of the connections by which the hosts and data storage system may be connected to the communication medium may pass through other communication devices, such switching equipment that may exist such as a phone line, a repeater, a multiplexer or even a satellite.

Each of the host computer systems may perform different types of data operations in accordance with different types of tasks. In the embodiment of FIG. 1, any one of the host computers 14a-14n may issue a data request to the data storage system 12 to perform a data operation. For example, an application executing on one of the host computers 14a-14n may perform a read or write operation resulting in one or more data requests to the data storage system 12.

It should be noted that although element 12 is illustrated as a single data storage system, such as a single data storage array, element 12 may also represent, for example, multiple data storage arrays alone, or in combination with, other data storage devices, systems, appliances, and/or components having suitable connectivity, such as in a SAN (storage area network) or LAN (local area network), in an embodiment using the techniques herein. It should also be noted that an embodiment may include data storage arrays or other components from one or more vendors. In subsequent examples illustrated the techniques herein, reference may be made to a single data storage array by a vendor. However, as will be appreciated by those skilled in the art, the techniques herein are applicable for use with other data storage arrays by other vendors and with other components than as described herein for purposes of example.

The data storage system 12 may be a data storage appliance or a data storage array including a plurality of data storage devices (PDs) 16a-16n. The data storage devices 16a-16n may include one or more types of data storage devices such as, for example, one or more rotating disk drives and/or one or more solid state drives (SSDs). An SSD is a data storage device that uses solid-state memory to store persistent data. SSD may refer to solid state electronics devices as distinguished from electromechanical devices, such as hard drives, having moving parts. Flash devices or flash memory-based SSDs are one type of SSD that contains no moving mechanical parts. The flash devices may be constructed using nonvolatile semiconductor NAND flash memory. The flash devices may include, for example, one or more SLC (single level cell) devices and/or MLC (multi level cell) devices.

The data storage array may also include different types of adapters or directors, such as an HA 21 (host adapter), RA 40 (remote adapter), and/or device interface 23. Each of the adapters may be implemented using hardware including a processor with local memory with code stored thereon for execution in connection with performing different operations. The HAs may be used to manage communications and data operations between one or more host systems and the global memory (GM). In an embodiment, the HA may be a Fibre Channel Adapter (FA) or other adapter which facilitates host communication. The HA 21 may be characterized as a front end component of the data storage system which receives a request from the host. The data storage array may include one or more RAs that may be used, for example, to facilitate communications between data storage arrays. The data storage array may also include one or more device interfaces 23 for facilitating data transfers to/from the data storage devices 16a-16n. The data storage interfaces 23 may include device interface modules, for example, one or more disk adapters (DAs) (e.g., disk controllers), adapters used to interface with the flash drives, and the like. The DAs may also be characterized as back end components of the data storage system which interface with the physical data storage devices.

One or more internal logical communication paths may exist between the device interfaces 23, the RAs 40, the HAs 21, and the memory 26. An embodiment, for example, may use one or more internal busses and/or communication modules. For example, the global memory portion 25b may be used to facilitate data transfers and other communications between the device interfaces, HAs and/or RAs in a data storage array. In one embodiment, the device interfaces 23 may perform data operations using a system cache that may be included in the global memory 25b, for example, when communicating with other device interfaces and other components of the data storage array. The other portion 25a is that portion of memory that may be used in connection with other designations that may vary in accordance with each embodiment.

The particular data storage system as described in this embodiment, or a particular device thereof, such as a disk or particular aspects of a flash device, should not be construed as a limitation. Other types of commercially available data storage systems, as well as processors and hardware controlling access to these particular devices, may also be included in an embodiment.

Host systems provide data and access control information through channels to the storage systems, and the storage systems may also provide data to the host systems also through the channels. The host systems do not address the drives or devices 16a-16n of the storage systems directly, but rather access to data may be provided to one or more host systems from what the host systems view as a plurality of logical devices, logical volumes (LVs) which may also referred to herein as logical units (e.g., LUNs). A logical unit (LUN) may be characterized as a disk array or data storage system reference to an amount of disk space that has been formatted and allocated for use to one or more hosts. A logical unit may have a logical unit number that is an I/O address for the logical unit. As used herein, a LUN or LUNs may refer to the different logical units of storage which may be referenced by such logical unit numbers. The LUNs may or may not correspond to the actual or physical disk drives or more generally physical storage devices. For example, one or more LUNs may reside on a single physical disk drive, data of a single LUN may reside on multiple different physical devices, and the like. Data in a single data storage system, such as a single data storage array, may be accessed by multiple hosts allowing the hosts to share the data residing therein. The HAs may be used in connection with communications between a data storage array and a host system. The RAs may be used in facilitating communications between two data storage arrays. The DAs may be one type of device interface used in connection with facilitating data transfers to/from the associated disk drive(s) and LUN (s) residing thereon. A flash device interface may be another type of device interface used in connection with facilitating data transfers to/from the associated flash devices and LUN (s) residing thereon. It should be noted that an embodiment may use the same or a different device interface for one or more different types of devices than as described herein.

In an embodiment in accordance with techniques herein, the data storage system as described may be characterized as having one or more logical mapping layers in which a logical device of the data storage system is exposed to the host whereby the logical device is mapped by such mapping layers of the data storage system to one or more physical devices. Additionally, the host may also have one or more additional mapping layers so that, for example, a host side logical device or volume is mapped to one or more data storage system logical devices as presented to the host.

It should be noted that although examples of techniques herein may be made with respect to a physical data storage system and its physical components (e.g., physical hardware for each HA, DA, HA port and the like), techniques herein may be performed in a physical data storage system including one or more emulated or virtualized components (e.g., emulated or virtualized ports, emulated or virtualized DAs or HAs), and also a virtualized or emulated data storage system including virtualized or emulated components.

Also shown in FIG. 1 is a management system 22a that may be used to manage and monitor the system 12. In one embodiment, the management system 22a may be a computer system which includes data storage system management software or application such as may execute in a web browser. A data storage system manager may, for example, view information about a current data storage configuration such as LUNs, storage pools, and the like, on a user interface (UI) in a display device of the management system 22a. Alternatively, and more generally, the management software may execute on any suitable processor in any suitable system. For example, the data storage system management software may execute on a processor of the data storage system 12.

It should be noted that each of the different adapters, such as HA 21, DA or disk interface, RA, and the like, may be implemented as a hardware component including, for example, one or more processors, one or more forms of memory, and the like. Code may be stored in one or more of the memories of the component for performing processing.

The device interface, such as a DA, performs I/O operations on a physical device or drive 16a-16n. In the following description, data residing on a LUN may be accessed by the device interface following a data request in connection with I/O operations. For example, a host may issue an I/O operation which is received by the HA 21. The I/O operation may identify a target location from which data is read from, or written to, depending on whether the I/O operation is, respectively, a read or a write operation request. The target location of the received I/O operation may be expressed in terms of a LUN and logical address or offset location (e.g., LBA or logical block address) on the LUN. Processing may be performed on the data storage system to further map the target location of the received I/O operation, expressed in terms of a LUN and logical address or offset location on the LUN, to its corresponding physical storage device (PD) and location on the PD. The DA which services the particular PD may further perform processing to either read data from, or write data to, the corresponding physical device location for the I/O operation.

It should be noted that an embodiment of a data storage system may include components having different names from that described herein but which perform functions similar to components as described herein. Additionally, components within a single data storage system, and also between data storage systems, may communicate using any suitable technique that may differ from that as described herein for exemplary purposes. For example, element 12 of FIG. 1 may be a data storage system, such as the Dell EMC Unity® data storage system. that includes multiple storage processors (SPs). Each of the SPs 27 may be a CPU including one or more "cores" or processors and each may have their own memory used for communication between the different front end and back end components rather than utilize a global memory accessible to all storage processors. In such embodiments, memory 26 may represent memory of each such storage processor.

Generally, techniques herein may be used in connection with any suitable storage system, appliance, device, and the like, in which data is stored. For example, an embodiment may implement techniques herein using a midrange data storage system, such as a Dell EMC Unity® data storage system, as well as a high end or enterprise data storage system, such as a Dell EMC™ PowerMAX™ data storage system.

The data path or I/O path may be characterized as the path or flow of I/O data through a system. For example, the data or I/O path may be the logical flow through hardware and software components or layers in connection with a user, such as an application executing on a host (e.g., more generally, a data storage client) issuing I/O commands (e.g., SCSI-based commands, and/or file-based commands) that read and/or write user data to a data storage system, and also receiving a response (possibly including requested data) in connection such I/O commands.

The control path, also sometimes referred to as the management path, may be characterized as the path or flow of data management or control commands through a system. For example, the control or management path may be the logical flow through hardware and software components or layers in connection with issuing data storage management command to and/or from a data storage system, and also receiving responses (possibly including requested data) to such control or management commands. For example, with reference to FIG. 1, the control commands may be issued from data storage management software executing on management system 22a to the data storage system 12. Such commands may be, for example, to establish or modify data services, provision storage, perform user account management, and the like. For example, commands may be issued over the control path to provision storage for LUNs, create a snapshot, define conditions of when to create another snapshot, define or establish local and/or remote replication services, define or modify a schedule for snapshot or other data replication services, define a RAID group, obtain data storage management and configuration information for display in a graphical user interface (GUI) of a data storage management program or application, generally modify one or more aspects of a data storage system configuration, list properties and status information regarding LUNs or other storage objects (e.g., physical and/or logical entities in the data storage system), and the like.

The data path and control path define two sets of different logical flow paths. In at least some of the data storage system configurations, at least part of the hardware and network connections used for each of the data path and control path may differ. For example, although both control path and data path may generally use a network for communications, some of the hardware and software used may differ. For example, with reference to FIG. 1, a data storage system may have a separate physical connection 29 from a management system 22a to the data storage system 12 being managed whereby control commands may be issued over such a physical connection 29. However, it may be that user I/O commands are never issued over such a physical connection 29 provided solely for purposes of connecting the management system to the data storage system. In any case, the data path and control path each define two separate logical flow paths.

An embodiment of a data storage system in accordance with techniques herein may perform different data processing operations or services on stored user data. For example, the data storage system may perform one or more data reduction operations, such as data deduplication and compression, as well as other types of operations or services. Such data reduction operations attempt to reduce the amount of storage needed for storing data on non-volatile backend storage devices (e.g., PDs) with the goal of reducing the cost per unit of storage consumed (e.g., dollar cost per GB of storage). Generally, data deduplication and compression techniques are known in the art and any suitable such technique may be used in an embodiment in accordance with techniques herein. In at least one embodiment, the compression technique may be a lossless compression technique such as an algorithm from the Lempel Ziv algorithm family (e.g., LZ77, LZ78, LZW, LZR, and the like). In at least one embodiment in accordance with techniques herein, data deduplication processing performed may include digest or hash value computation using an algorithm such as based on the SHA-256 hashing algorithm known in the art. Data deduplication generally refers to removing redundant or duplicate data portions. Data deduplication techniques may include looking for duplicate data chunks whereby only a single instance of the data chunk is retained (stored on physical storage) and where pointers or references may be used in connection with duplicate or redundant copies (which reference or identify the single stored instance of the data chunk).

Figure 2A:
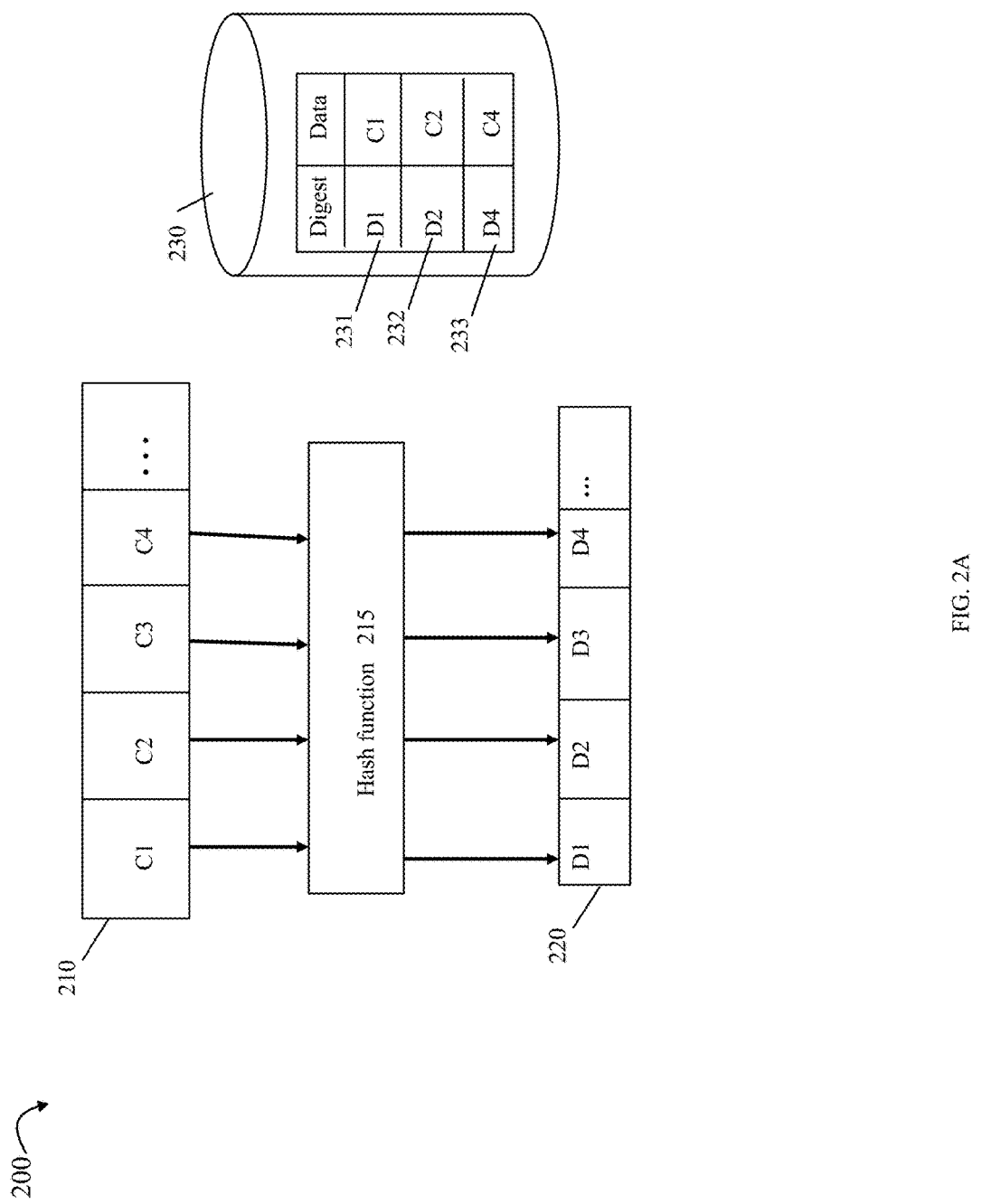
FIG. 2A is an example illustrating data deduplication as may be performed in an embodiment in accordance with techniques herein.

Referring to FIG. 2A, shown is an example 200 illustrating processing that may be performed in connection with data deduplication processing in an embodiment in accordance with techniques herein. Element 210 may denote the original data being written or stored on back-end non-volatile storage. The original data may be partitioned into multiple data chunks C1, C2, C3, C4 and the like. In at least one embodiment and for purposes of illustration, the data chunks may all be the same size where the size may vary with embodiment. As a variation depending on the data deduplication technique utilized, the chunks of 210 may be of varying or different sizes. Each chunk is provided as an input to hash function 215. As noted above, in at least one embodiment, the hash function 215 may be the SHA-256 hashing algorithm, or more generally, any suitable cryptographic hashing function known in the art. For each chunk of 210, the hash function 215 may perform processing and generate, as an output, a hash value or digest. Element 220 includes digests D1, D2, D3, D4, and the like, where a corresponding different one of the digests DN is generated for one of the chunks CN (where "N" is an integer denoting the chunk and associated digest generated for that chunk). For example, D1 is the digest generated for C1, D2 is the digest generated for C2, D3 is the digest generated for C3, and so on. Generally, a hash function 215 is selected which has an acceptably low probability of a "hash collision" of generating the same digest or hash value for two different chunks. The strength of the hash function 215 may be measured by the unlikelihood of a collision occurring two different input chunks of data produce the same digest. The strength increases with the bit length of the hash value or digest. Thus, if two chunks, such as C1 and C3, have the same digests whereby D1=D3, then chunks C1 and C3 match (e.g., are identical matching data chunks). If two chunks, such as C1 and C4, have different digests whereby D1 does not equal D4, then chunks C1 and C4 do not match (e.g., are different or non-matching data chunks). In cases where two matching or identical chunks have the same digest, only a single copy of the data chunk is stored on backend non-volatile physical storage of the data storage system. The single stored instance of the data chunk may be referenced using a pointer, handle, the digest of the chunk, and the like.

Element 230 of FIG. 2A may denote the data store used to store data chunks. In this example, as noted above, assume chunks C1 and C3 are the same with remaining chunks C2 and C4 being unique. The data store 230 may also be referred to as a single instance store (SIS). In at least one embodiment, element 230 may be organized and managed using a data structure, such as a hash table. In at least one embodiment, computed digests may be used as an index into the hash table where the single unique instances of data chunks may be stored (along with other metadata as may be needed for maintaining the table and also in accordance with the particular hash table management used in an embodiment). Hash tables are data structures known in the art. A hash table uses a hash function to compute an index into an array of buckets or slots, from which the desired data can be found. In this example, the chunk of data may be mapped by hash function 215, and thus by the chunk's digest, to a particular entry in the table at which the chunk data is stored. To further illustrate, the hash function 215 may be used to generate a digest for a particular data chunk. The digest is then further mapped (e.g., such as by another mathematical function, using particular portions of the digest, and the like) to a particular index or entry of the hash table. The particular mapping used to map the digest to a corresponding table entry varies, for example, with the digest and the size of hash table.

When storing a new data chunk, such as C1, its digest may be mapped to a particular hash table entry 231 whereby if the table entry is null/empty, or otherwise does not already include a data chunk matching C1, then C1 is stored in the table entry along with its associated digest D1 (this is the first time chunk C1 is recorded in the data store 230). Otherwise, if there is already an existing entry in the table including a data chunk matching C1, it indicates that the new data chunk is a duplicate of an existing chunk. In this example as noted above, processing is performed for C1, C2, and C4 respectively, where entries 231, 232, and 233 are added since there are no existing matching entries in the hash table. When processing chunk C3, as noted above, C3 has a digest D3 matching D1 whereby C3 (and thus D3) maps to entry 231 of the hash table already including a matching chunk C1 (so no additional data chunk is added to 230 for C3 since C3 is determined as a duplicate of C1). In connection with representing a particular file or other storage entity including multiple duplicate occurrences of a particular chunk such as C3, the single instance or copy of the data may be stored in 230. Additionally, a handle or reference, such as identifying the hash table entry 231, its digest, and the like, may be used to reference the single instance or copy of the data storage in 230. When reconstructing or restoring data such as the file to its original form, the handle or reference into the hash table for chunk C3 may be used to obtain the actual C3 chunk of data from 230.

Figure 2B:
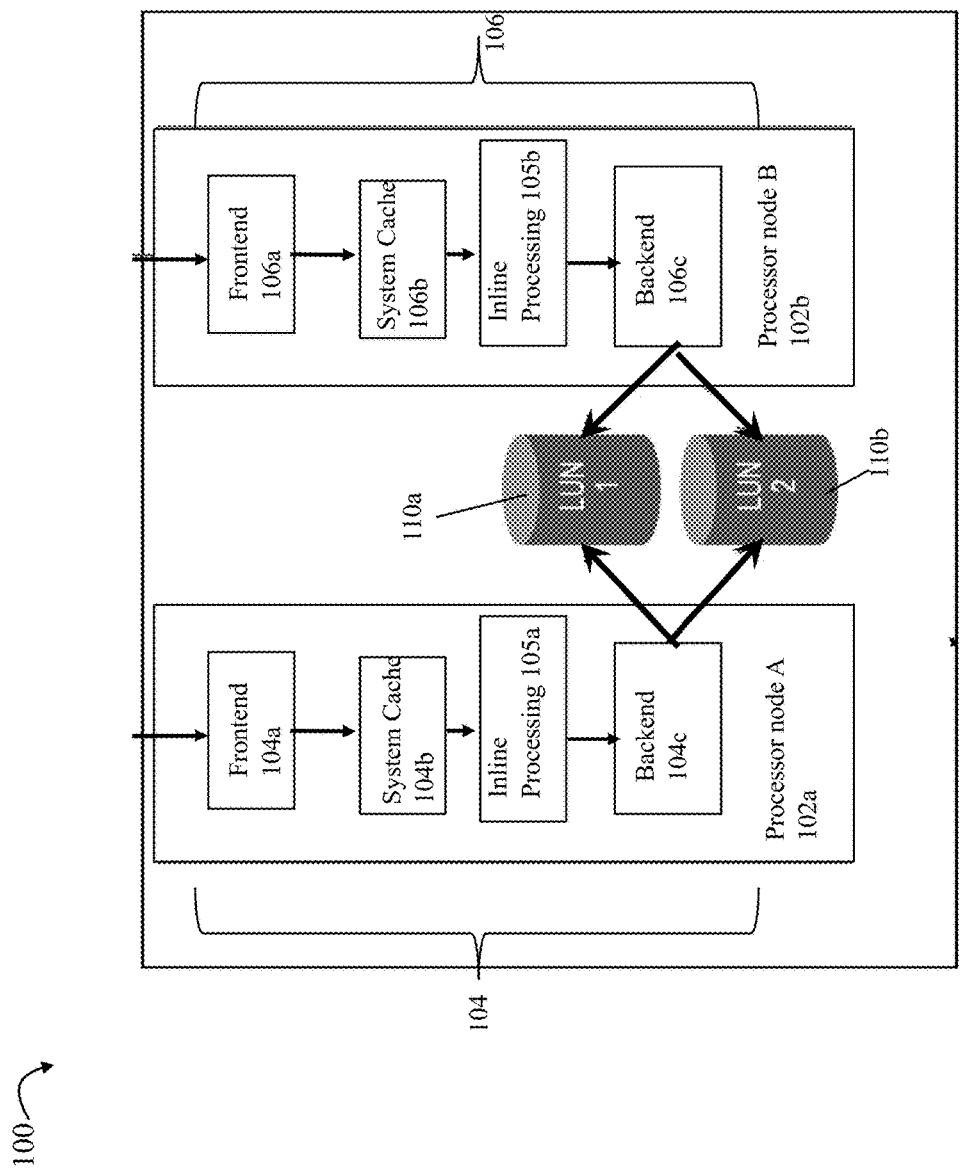

With reference to FIG. 2B, shown is an example 100 illustrating components that may be included in the data path in at least one existing data storage system in accordance with techniques herein. The example 100 includes two processor nodes A 102a and B 102b and associated software stacks 104, 106 of the data path where I/O requests may be received by either processor node 102a or 102b. In the example 200, the data path 104 of processor node A 102a includes: the frontend (FE) component 104a (e.g., an FA or front end adapter) that translates the protocol-specific request into a storage system-specific request; a system cache layer 104b where data is temporarily stored; an inline processing layer 105a; and a backend (BE) component 104c that facilitates movement of the data between the system cache and permanent non-volatile storage (e.g., back end physical non-volatile storage devices accessed by BE components such as DAs as described herein). During movement of data in and out of the system cache layer 104b (e.g., such as in connection with read and writing data respectively, to physical storage 110a, 110b, inline processing may be performed by layer 105a. Such inline processing operations of 105a may be optionally performed and may include any one of more data processing operations in connection with data that is flushed from system cache layer 104b to back-end non-volatile physical storage 110a, 110b, as well as when retrieving data from back-end non-volatile physical storage 110a, 110b to be stored in system cache layer 104b.

In at least one embodiment, the inline processing may include performing compression and data duplication. Although in following paragraphs reference may be made to inline processing including compression and data deduplication, more generally, the inline processing may include performing any suitable or desirable data processing operations as part of the I/O or data path (e.g., where such operations may include any of compression and data deduplication, as well as any other suitable data processing operation).

In a manner similar to that as described for data path 104, the data path 106 for processor node B 102b has its own FE component 106a, system cache layer 106b, inline processing layer 105b, and BE component 106c that are respectively similar to components 104a, 104b, 105a and 104c. Elements 110a, 110b denote physical storage provisioned for LUNs whereby an I/O may be directed to a location or logical address to read data from, or write data to, the logical address. The LUNs 110a, 110b are examples of storage objects representing logical storage entities included in an existing data storage system configuration. Since, in this example, writes directed to LUNs 110a, 110b may be received for processing by either of the nodes 102a and 102b, the example 100 illustrates what may also be referred to as an active-active configuration.

In connection with a write operation as may be received from a host and processed by processor node A 102a, the write data may be written to the system cache 104b, marked as write pending (WP) denoting it needs to be written to physical storage 110a, 110b and, at a later point in time, the write data may be destaged or flushed from the system cache to the physical storage 110a, 110b by the BE component 104c. The write request may be considered complete once the write data has been stored in the system cache whereby an acknowledgement regarding the completion may be returned the host (e.g., by component 104a). At various points in time, WP data stored in the system cache is flushed or written out to physical storage 110a, 110b. In connection with inline processing layer 105a, prior to storing the original data on physical storage 110a, 110b, compression and data deduplication processing may be performed that converts the original data (as stored in the system cache prior to inline processing) to a resulting form (that may include compressed and/or deduplicated portions) which is then written to physical storage 110a, 110b. In at least one embodiment, when deduplication processing determines that a portion (such as a chunk) of the original data is a duplicate of an existing data portion already stored on 110a, 110b, that particular portion of the original data is not stored in a compressed form and may rather be stored in its deduplicated form (e.g., there is no need for compression of a chunk determined to be duplicate of another existing chunk). If the original data portion is not a duplicate of an existing portion already stored on 110a, 110b, the original data portion may be compressed and stored in its compressed form on 110a, 110b.

In connection with a read operation to read a chunk of data, a determination is made as to whether the requested read data chunk is stored in its original form (in system cache 104b or on physical storage 110a, 110b), or whether the requested read data chunk was previously deduplicated or compressed. If the requested read data chunk (which is stored in its original decompressed, non-deduplicated form) is in system cache, the read data chunk is retrieved from the system cache 104b and returned to the host. Otherwise, if the requested read data chunk is not in system cache 104b but is stored on physical storage 110a, 110b in its original form, the requested data chunk is read by the BE component 104c from the backend storage 110a, 110b, stored in the system cache and then returned to the host.

If the requested read data chunk was previously deduplicated, the read data chunk is recreated and stored in the system cache in its original form so that it can be returned to the host. If the requested read data chunk was previously compressed, the chunk is first decompressed prior to sending the read data chunk to the host. If the compressed read data chunk is already stored in the system cache, the data is uncompressed to a temporary or buffer location, the uncompressed data is sent to the host, and the buffer or temporary location is released. If the compressed read data chunk is not in system cache but stored on physical storage 110a, 110b, the compressed read data chunk may be read from physical storage 110a, 110b into system cache, uncompressed to a buffer or temporary location, and then returned to the host. Thus, requested read data stored on physical storage 110a, 110b may be stored in a deduplicated or compressed form as noted above where processing is performed by 105a to restore or convert the deduplicated or compressed form of the data to its original data form prior to returning the requested read data to the host.

In connection with techniques herein, each processor or CPU may include its own private dedicated CPU cache (also sometimes referred to as processor cache) that is not shared with other processors. In at least one embodiment, the CPU cache, as in general with cache memory, may be a form of fast memory (relatively faster than main memory which may be a form of RAM). In at least one embodiment, the CPU or processor cache is on the same die or chip as the processor and typically, like cache memory in general, is far more expensive to produce than normal RAM such as may be used as main memory. Processor cache is substantially faster than the system RAM such as used as main memory and contains information that the processor will be immediately and repeatedly accessing. The faster memory of the CPU cache may, for example, run at a refresh rate that's closer to the CPU's clock speed, which minimizes wasted cycles. In at least one embodiment, there may be two or more levels (e.g., L1, L2 and L3) of cache. The CPU or processor cache may include at least an L1 level cache that is the local or private CPU cache dedicated for use only by that particular processor. The two or more levels of cache in a system may also include at least one other level of cache (LLC or lower level cache) that is shared among the different CPUs. The L1 level cache serving as the dedicated CPU cache of a processor may be the closest of all cache levels (e.g., L1-L3) to the processor which stores copies of the data from frequently used main memory locations. Thus, the system cache as described herein may include the CPU cache (e.g., the L1 level cache or dedicated private CPU/processor cache) as well as other cache levels (e.g., the LLC) as described herein. Portions of the LLC may be used, for example, to initially cache write data which is then flushed to the backend physical storage.

When the processor performs processing, such as in connection with inline processing 105a, 105b as noted above, data may be loaded from main memory and/or other lower cache levels into its CPU cache. In particular, inline compression (ILC) and inline data deduplication (ILD) may be performed as part of inline processing 105a, 105b. In at least one embodiment, the size of a data chunk processed by ILC and ILD may be 256 bytes.

Compression processing such as performed by ILC threads is generally a CPU intensive operation. However, as discussed in more detail herein, there is a relationship between entropy and data compression where a computed entropy value for a data chunk may denote a measure or degree of compressibility of the data chunk. Generally, computation of an entropy value for a data chunk may be characterized as lightweight in terms of CPU requirements as opposed to performing compression processing for the data chunk. In an embodiment in accordance with techniques herein, the computed entropy value for a data chunk may be used in determining whether or not to proceed with compressing the data chunk. The foregoing is generally more CPU efficient than actually compressing each data chunk in order to determine whether or not it (the data chunk) is compressible (and should therefore be stored in its compressed form), or otherwise achieves at least a minimum amount of data reduction (e.g., whether or not a compressed form of a data chunk has a reduced size that is less than the size of the original data chunk by at least a threshold amount) to warrant storing the chunk in its compressed form.

Information entropy may be characterized as the average rate at which information is produced by a stochastic source of data. The definition of entropy used in information theory is analogous to the definition used in statistical thermodynamics. The concept of information entropy was introduced by Claude Shannon in "A Mathematical Theory of Communication", The Bell System Technical Journal (Volume: 27, Issue: 3, July 1948; pages 379-423). The measure of information entropy associated with each possible data value may be expressed as the negative logarithm of the probability mass function for the value. When the data source has a lower-probability value (i.e., when a low-probability event occurs), the event carries more "information" ("surprisal") than when the source data has a higher-probability value. The amount of information conveyed by each event defined in this way becomes a random variable whose expected value is the information entropy. Generally, entropy refers to disorder or non-uniformity. As a metric, an entropy value denotes a measure of the randomness of data, or a random distribution of symbols.

The relationship between entropy and compressibility is discussed, for example, in "Relationship Between Entropy and Test Data Compression", Kedarnath J. Balakrishnan and Nur A. Touba, IEEE Transactions on Computer-Aided Design of Integrated Circuits and Systems, Vol. 26, No. 2, February 2007, pages 386-395, and "Entropy and Compressibility of Symbol Sequences", Werner Ebeling, PhysComp96 (Physics and Computation 1996), Feb. 23, 1997, both of which are incorporated by reference herein. As explained in "Relationship between Entropy and Test Data Compression", entropy of a data set is a measure of the amount of information in the data set. Entropy calculations for fully specified data have been used to get a theoretical bound on how much the data can be compressed. In "Relationship between Entropy and Test Data Compression", the concept of entropy is extended for incompletely specified test data that has unspecified or don't care bits. "Entropy and Compressibility of Symbol Sequences" investigates long-range correlations in symbol sequences using methods of statistical physic and non-linear dynamics.

Entropy, H, with respect to a data set may be expressed as:

$$H = -\Sigma_{i=0}^{N-1} P_i \log_2(P_i) \quad \text{EQUATION 1}$$

Where $P_i$ is the probability of occurrence of symbol $X_i$ in the data set;

N is the total number of unique symbols; and $\log_2$ is the base 2 logarithm.

Generally, entropy for the data set depends on the symbol length L. Assume the data set is partitioned into sections where each section includes L bits of data. Thus L denotes number of bits in each section and L also denotes the length of the symbol. For a given symbol length, entropy for the data may be calculated to provide a value that denotes an expected or predicted level of compressibility for the data. Note that $P_i$, the probability of symbol $X_i$, refers to the actual frequency of the symbol $X_i$ in the data set. Thus, $P_i$ for $X_i$ may be calculated as the frequency or number of times $X_i$ appears in the data set divided by the total number of sections in the data set.

It should be noted, although particular values are selected for purposes of illustration, generally the entropy value used with techniques herein may be included for any size data chunk or data set that may include symbols of any suitable number of bits (e.g., any symbol length) having any number of unique symbols.

In at least one embodiment in accordance with techniques herein, L may be 8 where each symbol may include 8 bits (e.g., have a symbol length of 8). In such an embodiment, each symbol or bit pattern of 8 bits denotes a byte of information having a numerical data value (base 10) in the range from 0 to 255, inclusively. In such an embodiment, N, the number of unique symbols (e.g., numerical value of bit patterns) is 256, and EQUATION 1 for calculating entropy, H, may be expressed as:

$$H = -\sum_{i=0}^{255} P_i \log_2(P_i) \quad \text{EQUATION 2}$$

The entropy values calculated using EQUATION 1 and EQUATION 2 are (e.g., real numbers) within the inclusive range of 0 to 8, where 0 denotes the maximum expected level of compressibility of the data set and 8 denotes the minimum expected level of compressibility of the data set. For a given data set, the larger the entropy value (e.g., closer to 8), the more random the data and the less compressible the data set; and the smaller or lower the entropy value (e.g., close to 0), the more uniform the data and the more compressible the data set.

In at least one embodiment, an entropy value may be determined for each 8 KB (kilobyte) chunk of a data set. Thus, each 8 KB chunk includes 8192 bytes (e.g., 8*1024). Generally, the data set may be any defined set of stored data such as, for example, a database, one or more selected portions or logical address space portions of a database, data used by a particular application stored on one or more LUNs, selected portions of one or more LUNs, one or more files, one or more directories, one or more file systems, particular portions of one or more directories or file systems, and the like.

Figure 3:
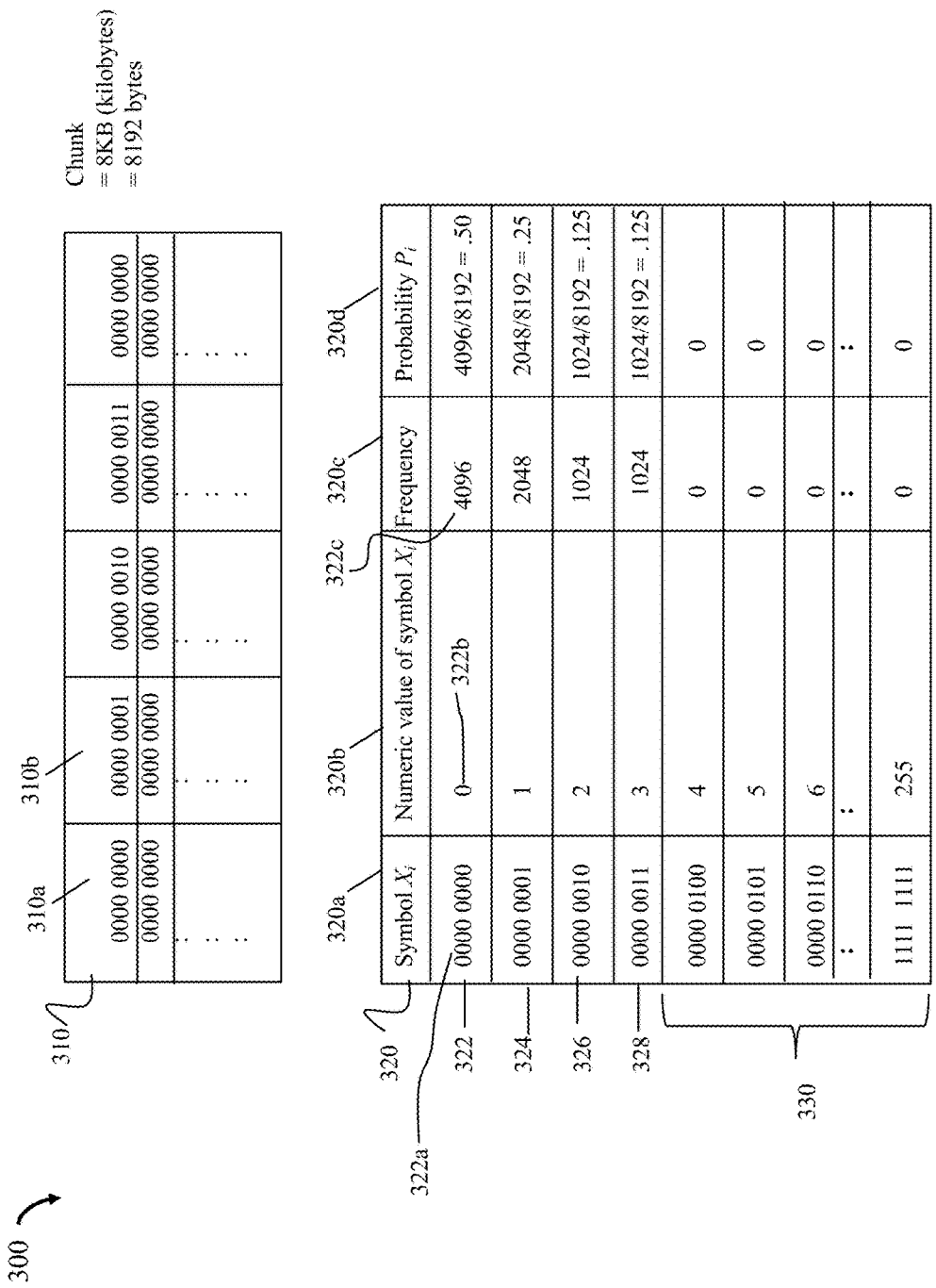
FIG. 3 is an example illustrating a data chunk and associated information that may be used in connection with calculating an entropy value for the data chunk an embodiment in accordance with techniques herein.

Referring to FIG. 3, shown is an example 300 illustrating a data chunk and associated information that may be used in an embodiment in accordance with techniques herein. The example 300 includes data chunk 310 having a size of 8 KB. The data chunk 310 may be partitioned into bytes or 8 bit segments where each byte denotes a symbol having a numeric value from 0 to 255, inclusively. For example, element 310a denotes a byte or symbol having a value of 0 and element 310b denotes a byte or symbol having a value of 1. To calculate the entropy for chunk 310, information in table 320 may be determined. Table 320 includes the following columns: symbol $X_i$ 320a, numeric value of symbol $X_i$ 320b, frequency of $X_i$ 320c and probability $P_i$. Each row of 320 includes a set of information for each unique symbol that can occur in the chunk. Thus, table 320 may include 256 rows, one row for each of the unique symbols having corresponding numeric values from 0 to 255, inclusively. Row 322 denotes that the numeric value 0 for symbol "0000 0000" has a frequency of 4096 and a probability $P_i$=0.50. Row 324 denotes that the numeric value 1 for symbol "0000 0001" has a frequency of 2048 and a probability $P_i$=0.25. Row 326 denotes that the numeric value 2 for symbol "0000 0010" has a frequency of 1024 and a probability $P_i$=0.125. Row 328 denotes that the numeric value 3 for symbol "0000 0011" has a frequency of 1024 and a probability $P_i$=0.125. Element 330 indicates that the remaining symbols each have a frequency=0 and thus a probability $P_i$=0. Based on EQUATION 2 and using the information from table 320 for the chunk 310, the calculated entropy value for chunk 310 is 1.75. Based on the range of possible entropy values from 0 to 8, inclusively, an embodiment may use the entropy value of 1.75 to determine whether or not to compress the chunk 310. For example, consistent with discussion herein, an embodiment may perform the entropy calculation for the chunk 310 inline as part of ILC processing of the I/O or data path, when writing or storing chunk 310 to PDs such as illustrated and described in connection with FIG. 2B. Based on the calculated entropy value for the chunk such as may be performed as part of ILC processing, an embodiment may determine whether to perform compression of the chunk inline as part of the I/O or data path.

In at least one embodiment, an entropy threshold may be specified where compression, such as part of ILC, may be performed for chunks having an entropy value less than the threshold. Otherwise, the chunk may not be compressed, such as in connection with ILC processing. Thus, the threshold denotes a maximum allowable entropy level in order for ILC to compress the chunk. Generally, any suitable value for the threshold may be selected. For example, in at least one embodiment, the threshold may be a value within the range of 5.0 to 6.0, inclusively.

Figure 4:
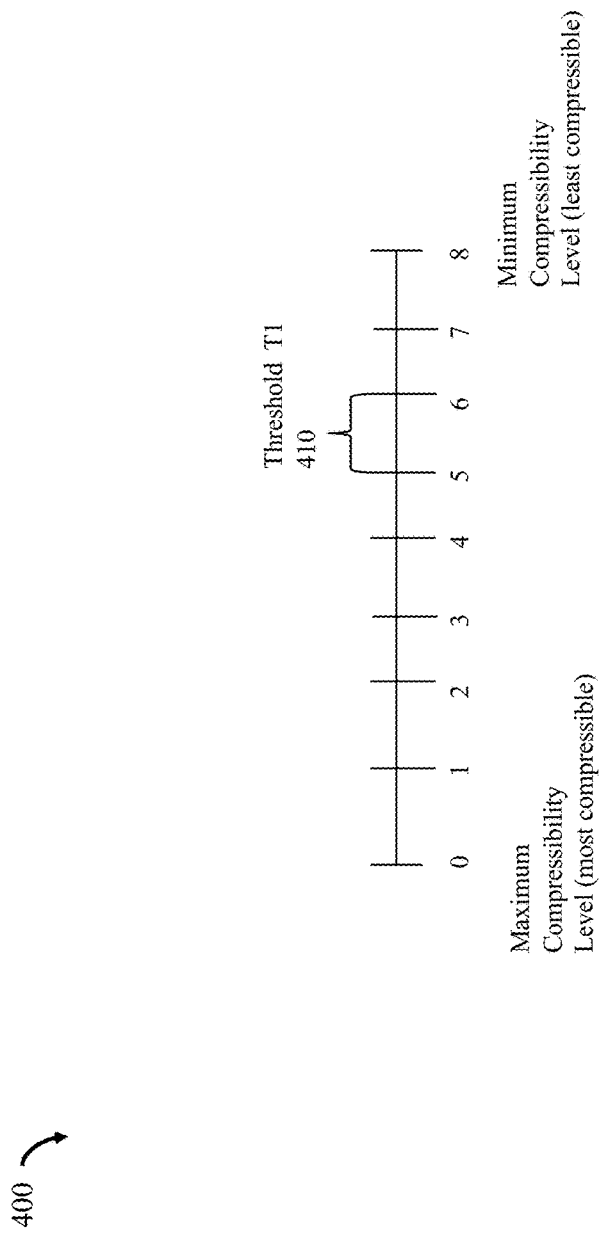
FIG. 4 is an example illustrating selection of an entropy threshold used in an embodiment in accordance with techniques herein.

Reference is made to FIG. 4 illustrating a threshold range within which a threshold for may be selected for use in an embodiment in accordance with techniques herein. The example 400 illustrates the possible range of entropy values from 0 to 8, inclusively where element 410 denotes that the entropy threshold T1 may be a value (e.g., real number) selected within the range of 5.0 to 6.0, inclusively. For example, assume T1 is selected as 6.0 whereby chunks have associated entropy values within the range 0 to 6.0, inclusively, are compressed. With reference to the example described above in connection with FIG. 3 for chunk 310 having an entropy value of 1.75, it may be determined to compress the chunk 310 inline (e.g., to perform compression processing of the chunk such as part of ILC processing).

As noted above, compression processing such as performed by ILC threads is generally a CPU intensive operation. As also described above, since a computed entropy value for a data chunk may denote a measure or degree of compressibility of the data chunk, such an entropy value may be used in determining whether or not the chunk is compressible, or more generally whether the compressed form of the chunk is expected to achieve at least a minimum amount of data reduction to warrant storing the chunk in its compressed form and incurring additional costs associated with such (e.g., additional CPU processing to decompress the chunk when reading the chunk from physical storage where the compressed form of the chunk is stored). Thus, as discussed above, the entropy value for a data chunk may be used in determining whether or not to actually proceed with compressing the data chunk. In at least one embodiment, after a chunk is compressed based on its entropy value being below a specified entropy threshold, the size of the compressed form of the chunk may be compared to the size of the original or uncompressed form of the chunk (e.g., provided as an input to compression processing) to determine whether at least a threshold amount or rate of data reduction has been achieved.

In at least one embodiment, a determination of whether a chunk of a data set is compressible (and therefore stored in its compressed form) or uncompressible (and therefore stored in uncompressed form) may be made in connection with an entropy value determined for the chunk or the amount or rate of data size reduction achieved as a result of compressing the chunk (e.g., comparison of original chunk size to the resulting size of compressed form of the chunk generated as an output of actual compression of the chunk, such as based on a compression ratio). For example, a chunk may be determined as uncompressible if its associated entropy value is greater than a specified entropy threshold as discussed above. In this case, the chunk may be stored in its uncompressed original form. As another example, a chunk may be determined as uncompressible if the chunk's entropy value is below a specified minimum entropy threshold but the compressed form of the chunk does not result in at least a specified amount or rate of data reduction when the size of the compressed chunk is compared to the original uncompressed size of the chunk input to compression processing. Thus, in this latter example, the chunk is actually compressed a first time but a determination is made that the chunk is uncompressible since the output of compression processing does not generate a compressed form of the chunk which is at least a specified rate or amount smaller than the original chunk. For example, in at least one embodiment, a minimum threshold in terms of compression ratio such as a percentage, N % (N being a positive integer), may be specified denoting the compressed form of a chunk must result in at least an N % reduction in size of the original uncompressed form of the chunk in order for the chunk to be characterized compressible and in order for the chunk to be stored in its compressed form.

Figure 5:
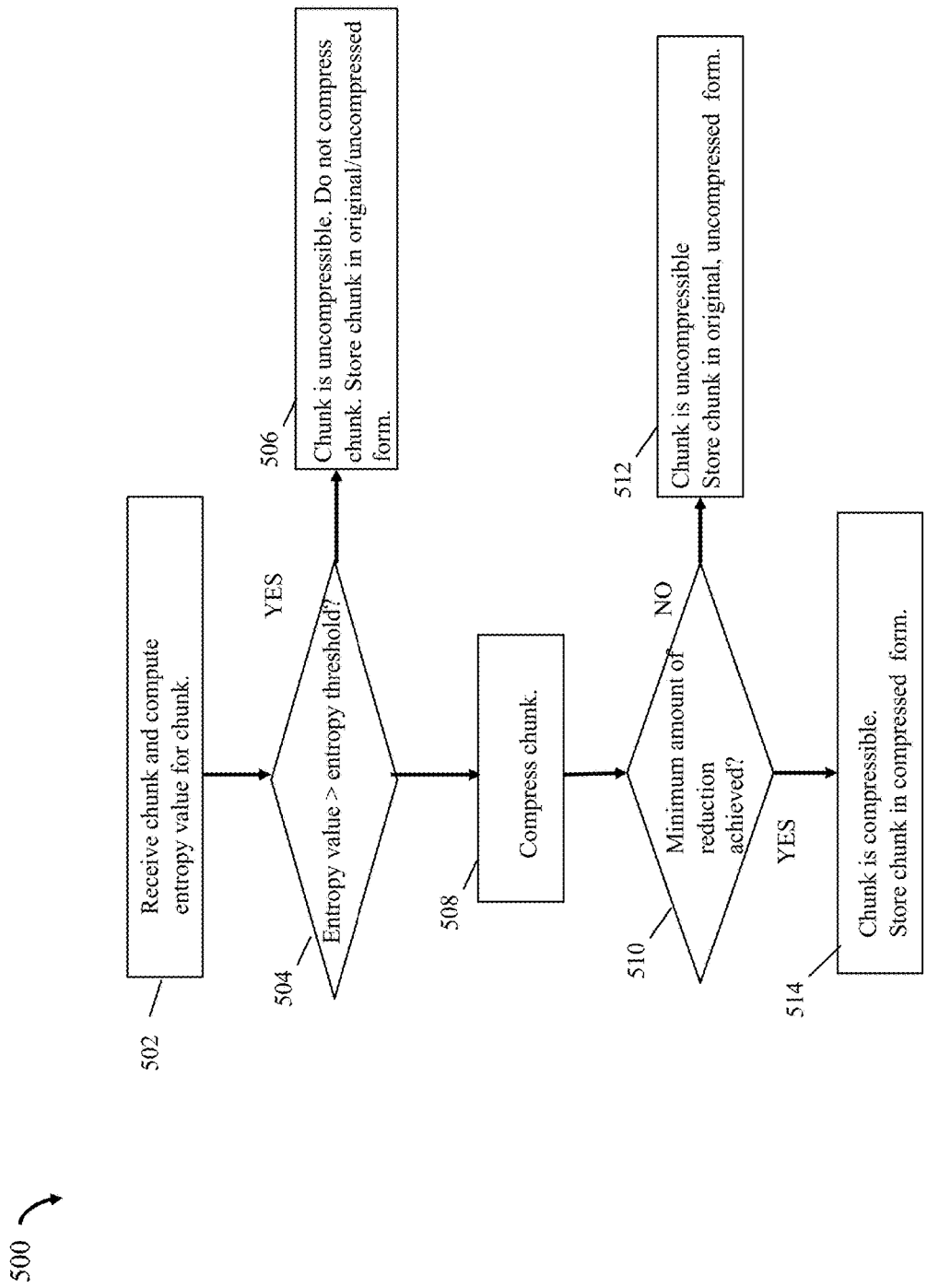
FIGS. 5, 7, 8 and 11 are flowcharts of processing steps that may be performed in an embodiment in accordance with techniques herein.

Referring to FIG. 5, shown is a flowchart of processing steps that may be performed in an embodiment in accordance with techniques herein. The flowchart 500 summarizes processing discussed above that may be performed in an embodiment in accordance with techniques herein. At step 502, a chunk is received and the entropy value for the chunk may be computed. From step 502, processing proceeds to step 504 where a determination is made as to whether the entropy value for the chunk is greater than the specified entropy threshold. If step 504 evaluates to yes, control proceeds to step 506. In step 506, the chunk is determined to be uncompressible based on its entropy value. Accordingly, the chunk is not compressed and the chunk is stored in its original, uncompressed form. If step 504 evaluates to no, control proceeds to step 508 where the chunk is compressed. From step 508, control proceeds to step 510. At step 510, a determination may be made as to whether at least a minimum amount or rate of data reduction (e.g., size of original uncompressed chunk as compared to size of compressed chunk) is achieved by compressing the chunk. If step 510 evaluates to no, control proceeds to step 512 where the chunk is characterized as uncompressible and is stored in its original uncompressed form. Otherwise, if step 510 evaluates to yes, control proceeds to step 514 where the chunk is characterized as compressible and stored in its compressed form.

Consistent with other discussion herein, it should be noted that the processing of the flowchart of FIG. 5 may be performed as part of inline processing of the I/O or data path, such as ILC, or may alternatively be performed in connection with a data set offline (e.g., not as part of the I/O or data path when servicing received I/O operations, such as write operations), such as with respect to a data set after the chunks have been written to the data set.

Generally, processing performed for determining an entropy value for a data chunk as discussed above includes counting the frequency of the different symbols in the data chunk. For example, as discussed above and with reference to FIG. 3, when processing a data chunk and determining an entropy value for the chunk, processing includes counting the frequency 320c of occurrence of each of the possible 256 symbols 320a, 320b represented by each byte/8 bits in the chunk. Such processing for counting the frequency of particular data items, such as symbols 320a, 320b, in a chunk, or more generally, a data stream or data set, may be characterized as determining a histogram or distribution of frequencies of the data items or symbols in the chunk, data stream or data set. Even more generally, a broader set of problems often referred to as "binning" also involves determining such a histogram or distribution of frequencies of the data items. For example, statistical data binning known in the art is a way to group a number of values into a smaller number of "bins". For example, if analyzing data about a group of people, it may be desirable to arrange their ages into a smaller number of age intervals, for example, grouping every five years together in a single bin and then determining the frequency or count of the number of people having an age falling into each of the bins. Generally, with binning, there are a number of bins or buckets each assigned a range of one or more of the possible data items or values. Thus, each possible data item or value is mapped to a particular bin. As each data item or value of a data set, chunk or stream is processed, the data item is mapped to its particular bin and the counter for the particular bin is incremented by one. In this manner, counters of the bins may be updated as each data item or value is processed in order to count the number of data items or values mapped, or falling into, each of the different bins.

In connection with determining the frequency distribution, such as the frequencies of column 320c for the 256 possible symbols (320a), data items or values (320b) used for determining an entropy value, or more generally, the frequency distribution used in connection with a histogram such as for binning, an embodiment may use techniques described in following paragraphs to optimize and expedite determining such a frequency distribution regarding the frequency of particular data items in a chunk, data stream or data set. Following paragraphs may describe use of such techniques in connection with the particular application of entropy value computation for data chunks such as part of ILC processing. However, such techniques are more generally applicable for use with determining any desired histogram or frequency distribution of any set of data items or value.

An embodiment in accordance with techniques herein may utilize the substantial CPU register space of modern CPUs, associated architectures, and instruction sets. For example, an embodiment in accordance with techniques herein may be performed by executing code in a system using one or more CPUs and the x86 instruction set and architecture by Intel®. An embodiment may, for example, utilize the Advanced Vector Extensions (AVX) of the x86 instruction set architecture (ISA) for microprocessors from Intel®, such as Intel® Advanced Vector Extensions 2 (Intel® AVX2) or Intel® Advanced Vector Extensions 512 (Intel® AVX-512). Generally, AVX are extensions to the x86 architecture where, for example, the Intel® AVX2 instruction set operates on 256 bit wide registers and the Intel® AVX-512 instruction set operates on 512 bit wide registers. Generally, as known in the art, the AVX instructions are also characterized as single instruction multiple data (SIMD) instructions that provide for increased processor throughput by performing multiple computations in a single instruction. Techniques herein may utilize the extended register set available, such as in the Intel®AVX2 and Intel® AVX-512 instruction sets, where the number of available registers as well as extended larger size of each register allows for storing multiple counters in each such register. The particular number of counters packed into each register may vary with the maximum possible frequency of each counter (e.g., which determines the number of bits of each counter needed to represent the maximum possible frequency value of each counter). Following paragraphs may reference particular instruction sets, CPU register sizes (e.g., number of bits of each register), number of available registers, and counter sizes (e.g., number of bits in each counter value) to illustrate use of techniques herein. However, techniques here may be generally used with any suitable instruction set, number of registers, register size and counter size such as, for example, where multiple counters may be stored into a single register. For example, techniques herein may also be used in connection with a suitable RISC ISA, where a single register has a sufficient number of bits for storing multiple counters.

Techniques in following paragraphs utilize such registers to decrease the need to access memory by keeping and managing the state variables for several independent calculations or several different random counter accesses in each of one or more of these registers. For example, as described in following paragraphs in at least one embodiment in accordance with techniques herein, all 256 counters (e.g., such as denoted by column 320c of FIG. 3) may be stored and maintained in multiple AVX2 or AVX-512 registers while computing the entropy value for a data chunk. Such registers may be used to store all 256 counters which are updated as processing may be performed to counter the frequency occurrence of each of the 256 possible symbols of each byte of the data chunk. In this manner, the counters stored in the registers may be accessed and incremented as needed during entropy value computation without the need to access other slower storage, such as CPU cache or other slower memory or non-volatile back end storage (e.g., PDs). As a result, the entropy computation processing, and in particular, determining the frequency distribution of the possible symbols or data items in chunk, may be optimized and performed much faster than if the counters are stored in other non-register locations (e.g., such as CPU cache or other slower memory or non-volatile back end storage (e.g., PDs)).

Prior to describing techniques herein, what will be described is a traditional access pattern or instruction template that may be performed in which the counters are stored in memory in at least one existing system not using techniques herein. In such an existing system not using techniques herein, a current counter value mapped to a particular data item, such as a particular symbol 320a or numeric value 320b of a particular symbol 320a, is retrieved from memory and updated/incremented each time an occurrence of the particular data item is processed, such as part of entropy computation in connection with ILC processing and such as generally illustrated in FIG. 5. For example, with reference back to FIG. 3, assume processing is performed to determine an entropy value for a data chunk that is 8 KB or 8192 bytes. The 256 frequency counters of column 320c may be implemented as an array or vector data structure stored on non-volatile storage. For example, the 256 counters of 320c may be implemented as a zero-based integer array (e.g., elements 0 . . . 255, inclusively) where each cell or array element may be indexed using the symbol's numeric value of 320b. For example, bucket or bin 0 is stored as array element [0], bucket or bin 255 is stored as array element [255], and the like. When a first byte of the chunk is read, it is determined to map to symbol, data item or data value 0 denoted by row 322. To increment the counter for bucket or bin 0 stored as array element[0], array element [0] is retrieved from memory or storage (e.g., such as using a load instruction) into a register; incremented (e.g., such as using an add instruction that stores the addition result with the updated counter into a result register); and then stored back into memory or storage (e.g., such as using a store instruction that stores the contents of the result register into memory). In a similar manner, each time as the next byte of the 8192 byte chunk is processed, a corresponding one of the array elements including a particular data item counter is updated. Thus, generally for the chunk of 8192 bytes, there may be 8192 memory accesses to load counter values and 8192 memory accesses to store updated counter values. As known in the art, such memory accesses are relatively slow as compared to other forms of data access. Although caching may be implemented and possibly provide some improvement in performance by caching recently accessed counter values, any possible such performance gains from caching are data dependent and vary with the particular data processed. Furthermore, as described in following paragraphs, techniques herein provide various embodiments for maintaining counters in registers such as for the duration of entropy computation. In this manner, the counter values, or at least a portion thereof, may remain in registers thereby omitting repeated required memory loads and stores for each data item (e.g., byte in this example) processed. Rather, for example, in at least one embodiment where all the counter values are stored and maintained in registers for the duration of entropy computation, the counter values may be written/stored to memory at most once. Thus, the repeated load and store pattern to access a counter for each data item processed is avoided.

What will now be described is an embodiment in accordance with techniques herein. In this embodiment, reference is made back again to the example of FIG. 3 where an entropy value is determined for each chunk of data having a chunk size of 8 KB or 8192 bytes. Each data item in the chunk is a byte or 8 bits. Thus, in table 320, columns 320a and 320b denote, respectively, the 256 possible symbols and numeric values for each byte of the chunk that is processed. As described herein, to determine the entropy value for the chunk 310, each byte of the chunk 310 may be read or input, mapped to a particular matching symbol entry (e.g., matching an entry of 320a and 320b) of the table 320, and then the counter of the corresponding matching symbol entry (e.g., frequency counter in 320c) may be incremented for the byte just read or input. In this example, assume that each counter value denoted by each frequency in an entry of 320c is a 32 bit integer value. Generally, the size or number of bits of each counter is capable of storing a numeric value denoting the maximum possible count or frequency that a symbol or data item may occur in a single chunk. For example, in this case where there are 8192 bytes in the chunk, each counter needs to have at least a sufficient number of bits able to represent the maximum possible counter value of 8192 (e.g., in the worst case, each byte of the 8192 chunk may be identical and may be any one of the possible 256 symbols 320*a* or values 320*b*). Thus, in one aspect, without any apriori or historical information about a particular data set, or chunks thereof, processed, the occurrence of any particular one of the 256 possible data items, such as byte-based symbols 320*a* or associated values 320*b*, may be characterized as random or pseudo-random in nature.

Based on the above 256 counters of 320*c* each of which is a 32-bit integer counter in this example, the data layout or configuration of the counters stored in registers may be determined. In at least one embodiment using the Intel® AVX-512 instruction set, there may be 32 registers available where each such register is 512 bits wide. In such an embodiment, 16 counters may be packed into a single 512 bit-wide register. Thus, in total, 16 512 bit wide registers may be configured to store the desired 256 counters of 320*c*.

Figure 6:
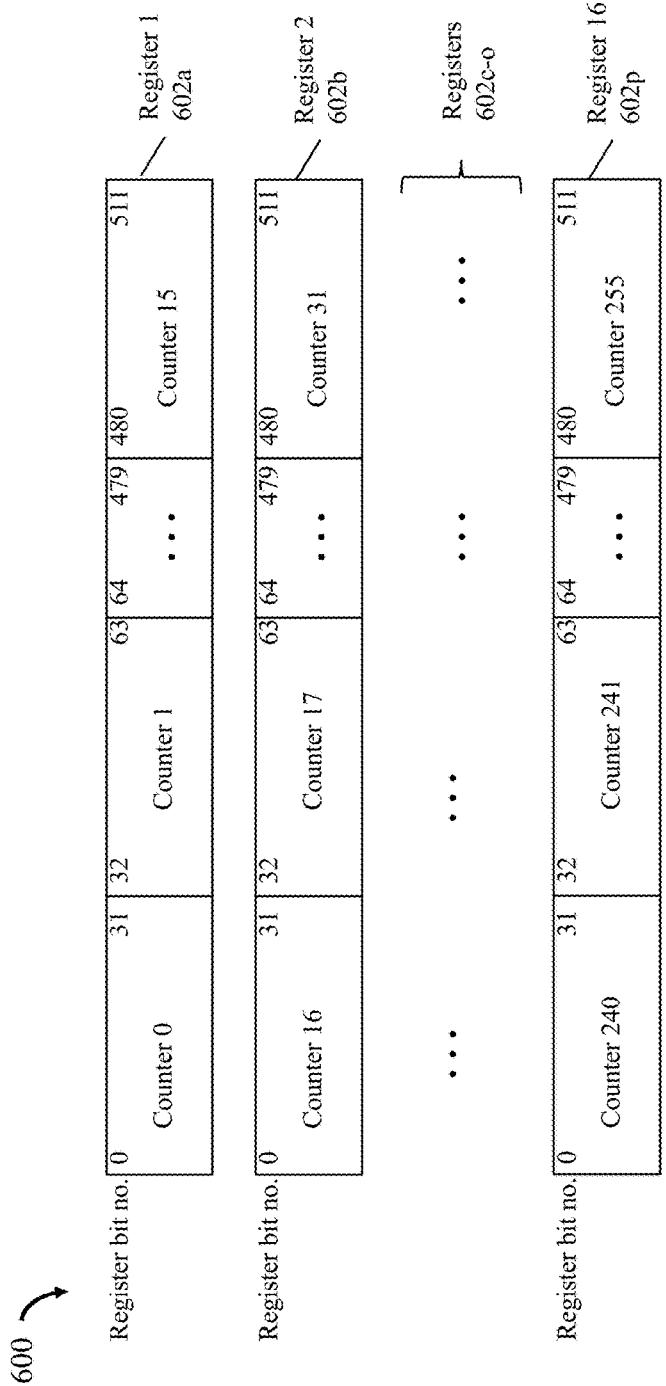
FIGS. 6 and 10 are examples illustrating different data layouts of counters stored in registers in an embodiment in accordance with techniques herein.

Referring to FIG. 6, shown is an example 600 of a data layout of 16 registers configured to store the desired 256 counters in an embodiment in accordance with techniques herein. Elements 602*a-p* denote the 16, 512 bit wide registers. Register 1 602*a* denotes a first 512 bit wide configured to store counters 0 through 15 corresponding, respectively, to the first 16 symbols of column 320*a*. Register 2 602*b* denotes a second 512 bit wide configured to store counters 16 through 31 corresponding, respectively, to the second 16 symbols of column 320*a*. In a similar manner, registers 602*c-o* denoted by the intervening ellipses may each store a next set 16 counters corresponding to a next set of 16 symbols of column 320*a*. Finally, register 16 602*p* denotes the $16^{th}$ 512 bit wide configured to store counters 240 through 255 corresponding, respectively, to the last 16 symbols of column 320*a*. In connection with the configuration of the data layout of FIG. 6, all 256 counters may be packed into 16 registers 602*a-p* at the same time.

In such an embodiment using the data layout of FIG. 6, all 256 counters may be maintained and stored in CPU registers for the duration of entropy computation processing without accessing memory at all to update counter values, and consequently, may result in much better performance than, for example, using the traditional access pattern or instruction template as discussed above.

Depending on the maximum frequency count needed, such as may be determined based on the number of bytes in a chunk, smaller counters (e.g., smaller than 32 bits each) may be utilized. For example, in an embodiment as discussed above with a chunk size of 8192 bytes and a maximum possible frequency count of 8192, each counter may be 16 bits, such as a 16 bit unsigned integer, rather than use the larger 32 bit counters as in FIG. 6. In such an embodiment, the data layout of 600 may be modified, for example, to pack 32, 16 bit counters in each of the 512 bit wide registers thereby only using a total of 8, 512 bit wide registers. As yet another variation, assume that each register is 256 bits rather than 512 bits wide and each counter is 16 bits. In this case, 16, 256 bit wide registers may be configured to pack the desired 256, 16 bit counters, in a manner similar to that as discussed above. As yet a further variation, assume that each register is 256 bits and each counter is 32 bits. In this case, 32, 256 bit wide registers may be configured to pack the desired 256, 32 bit counters, in a manner similar to that as discussed above. Generally, such variations regarding the size (e.g., number of bits) of each counter, number of counters, and size of each register may be used to determine the number of registers needed to store all desired counters.

Figure 7:
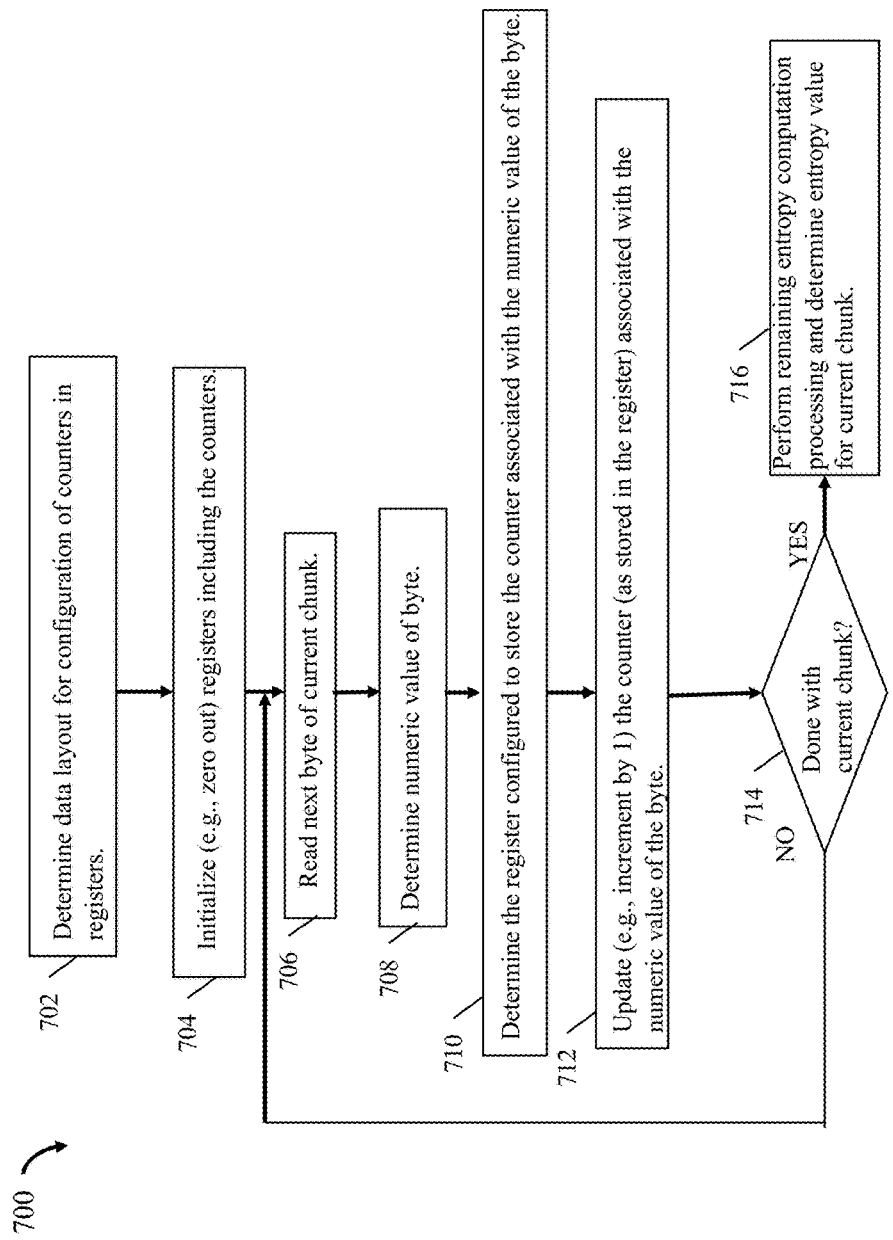

Referring to FIG. 7, shown is a flowchart 700 of processing steps that may be performed in an embodiment in accordance with techniques herein. The flowchart 700 summarizes processing as described above in connection with the layout of FIG. 6 where all counter values for all possible symbols, data items or values are stored in registers at the same time during entropy computation. At step 702, the data layout for the configuration of counters as stored in registers is determined. For example, the data layout as described in connection with FIG. 6 may be determined to store the desired 256 counters for the possible 256 symbols, data items or data values in 16 registers. From step 702, control proceeds to step 704 where the registers including the counters may be initialized, such as initializing all counters to zero (0). From step 704, control proceeds to step 706 where processing commences, such as in connection with entropy computation, for a current chunk. In step 706, the next byte of the current chunk is read. From step 706, control proceeds to step 708 where the numeric value of the byte just read in step 706 is determined. For example, the numeric value is one of the possible 256 data values in 320*b* of FIG. 3. From step 708, control proceeds to step 710 to determine the particular register, and location therein, configured to store the counter associated with the numeric value of the byte. From step 710, control proceeds to step 712 where the counter associated with the numeric value (e.g., determined in step 708) of the byte is updated, such as by incrementing the counter by one. Step 712 includes updating the counter value as stored in the particular register based on the data layout. Thus, step 712 involves incrementing the counter value associated with numeric value of the byte, where the counter value is stored in a register. No memory access is performed to obtain or store the counter value being updated in step 712. From step 712, control proceeds to step 714 where a determination is made as to whether processing is complete for the current chunk. If step 714 evaluates to no, control proceeds to step 706 to process the next byte of the current chunk. If step 714 evaluates to yes, control proceeds to step 716. Step 716 may include performing any remaining entropy computation processing needed to determine the entropy value for the current chunk. Consistent with other discussion herein, the entropy value may be determined using the counters of the frequencies of the different 256 possible numeric values for bytes of the chunk. Such counters may be used, for example, in calculating the entropy value for the chunk based on EQUATION 1 and EQUATION 2 as described herein. Although not specifically included in FIG. 7, the entropy value for the chunk may be used as described elsewhere herein, such as in connection with FIG. 5 processing to determine whether the chunk is compressible or uncompressible. In particular, the flowchart 700 processing may be performed as part of processing of step 502 of FIG. 5. It should be noted that steps 706, 708, 710, 712, 714 and 716 describe processing performed for a single chunk such as a single instance of an 8 KB chunk 310 of a data set. Generally, such processing of steps 706, 708, 710, 712, 714 and 716 may be repeated for each desired chunk of the data set for which an entropy value may be determined.

An embodiment in accordance with techniques herein may not have a sufficient number of available registers for use in a configuration or data layout in which all desired counters are stored in simultaneously in registers for entropy computation, or more generally, other binning processing in which a frequency distribution or histogram is determined. In such a case, an embodiment may choose to keep a portion of as many counters as possible in available registers with the remainder of the counters stored in memory. For example, assume each of the 256 counters is required to be 32 bits in size to store the maximum frequency count possible, such as may be determined based on the number of bytes in a chunk. In this case as described in the example 600 of FIG. 6, 16 512 bit registers may be needed in order to store all 256 counters. However assume further that the particular system configuration has only 8, 512 bit registers available for use with entropy computation. Thus, only half or 128, 32 bit counters may be stored in the 8, 512 bit registers. In such an embodiment, the 8, 512 bit registers available for use with entropy computation may be configured in a manner similar to that as discussed above to store 128 of the counters with the remaining 128 counters stored in memory. In this case, entropy computation may be performed to update appropriate ones of the 256 counters as bytes of the chunk are processed. For example, assume counters for numeric symbol values 0 through 127 (e.g., as denoted by the first 128 rows or entries of 320b of FIG. 5) are stored in the 8, 512 bit wide registers; and assume the remaining counters for numeric symbol values 128 through 255 (e.g., as denoted by the last 128 rows or entries of 320b of FIG. 5) are stored in memory. In this case, a byte having a numeric value that is in the inclusive range 0 through 127 may result in a corresponding one of the counters stored in one of the 8 registers incremented without accessing memory; and a byte having a numeric value that is in the inclusive range 128 through 255 may result in a corresponding one of the counters stored in memory being incremented such as described above using the traditional access pattern or instruction template (e.g., counter value is loaded from memory to a register, incremented where the incremented result is stored in a result register, and then the updated counter value of the result register is stored or written out to memory or storage). In this manner, a performance gain may be obtained at least for those counters stored in the 8, 512 bit wide registers. Generally, if the probability of occurrence of each symbol, possible data item, or value is random or uniform, then an embodiment may randomly select any half of the associated counters to be stored in registers for the duration of entropy computation and the remaining half to be stored in memory. As a variation, if an embodiment has apriori knowledge regarding the expected probability of occurrence of each of the different possible symbols, data items or data values, then an embodiment may select counters of those symbols, data items or data values having the highest probability of occurrence to be stored in the registers and those symbols, data items or data values having the lower/least probability of occurrence to be stored in memory (e.g., not in registers) during entropy computation. For example, consider the embodiment where there are sufficient registers available to only store half or 128 of the 256 counters needed. In this case, the symbols, data items or values may be ranked, from highest to lowest probability of occurrence, where the highest ranked 128 symbols, data items or values have their corresponding counters stored simultaneously in the 8 registers during entropy computation, and where the remaining 128 symbols, data items or values have their corresponding counters stored in memory (e.g., accessed using the traditional access pattern or instruction template each time a counter needs to be incremented for a processed byte having a particular numeric value mapped to the counter).

An embodiment may obtain such probabilistic information regarding the expected probability of occurrence of the possible symbols, data items or values in any suitable manner. For example, such probabilistic information may be based on historical data obtained in connection with prior processing of a data set. For example, an embodiment may not initially have any probabilistic information regarding the expected probability of occurrence of the symbols of 320a of FIG. 3. After processing a number of chunks, probabilistic information may be obtained in a cumulative manner based on the observed frequency of occurrences of the symbols of 320a encountered. In such an embodiment, as each chunk is processed and its entropy value determined, processing may be performed to also track cumulative probabilities of each of the symbols 320a across/with respect to multiple chunks of the data set that have been processed. For example, an embodiment may store in memory a cumulative probability table of information for the symbols of 320a and associated cumulative probabilities (e.g., cumulative values for 320d of FIG. 3. Periodically, such as prior to processing each next chunk or specified number of chunks of the data set, the symbols, data items or values may be ranked, from highest to lowest cumulative probability of occurrence, where the highest ranked 128 symbols, data items or values have their corresponding counters stored simultaneously in the 8 registers during entropy computation, and where the remaining 128 symbols, data items or values have their corresponding counters stored in memory (e.g., accessed using the traditional access pattern or instruction template each time a counter needs to be incremented for a processed byte having a particular numeric value mapped to the counter). Any needed swapping or rearrangement of counters between memory and register storage for the duration of entropy computation may be performed prior to processing the next chunk of the data set. In this manner, the cumulative probabilities may be updated and dynamically adapted as the chunks of the data set may change over time.

Figure 8:
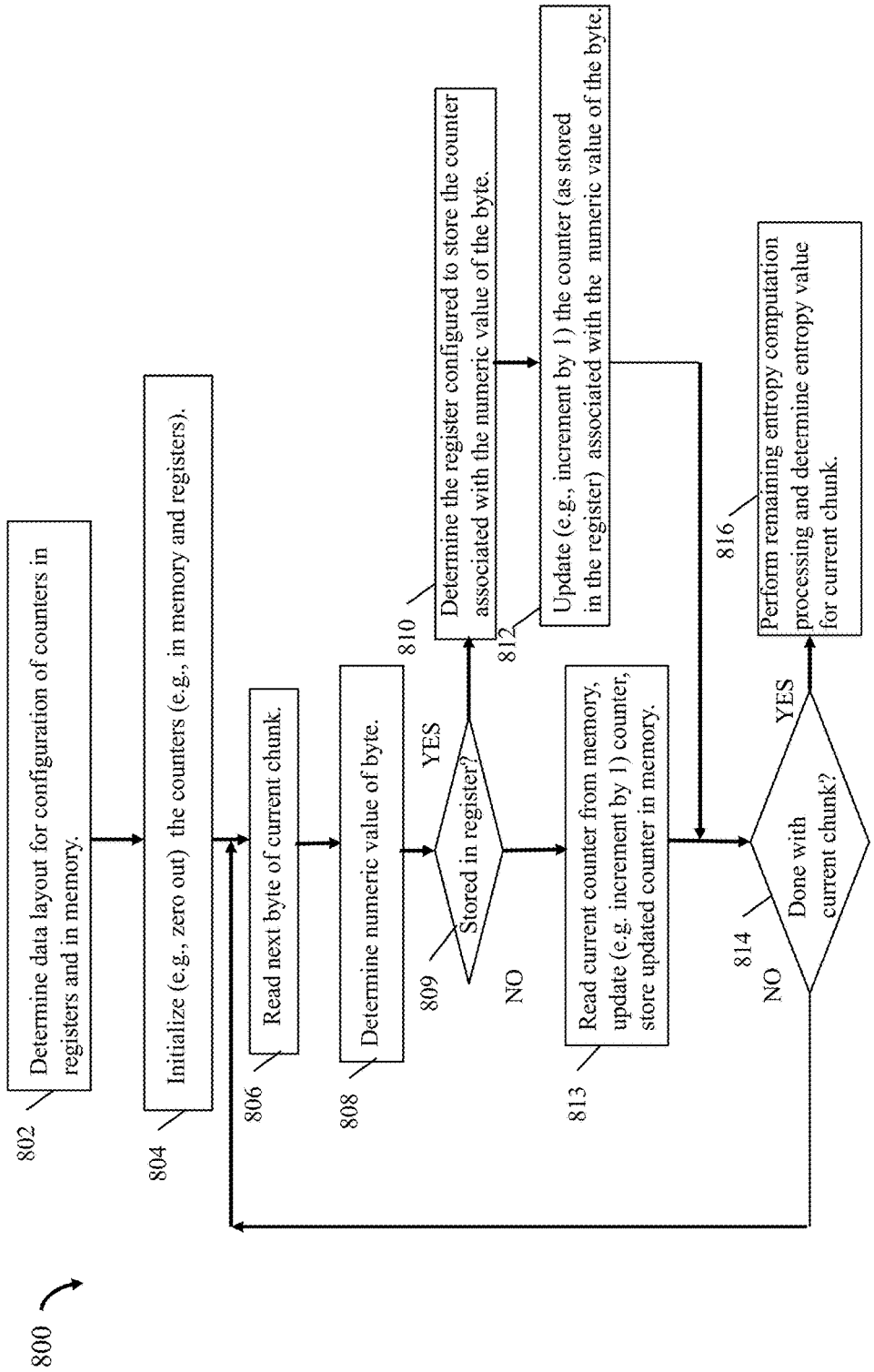

Referring to FIG. 8, shown is another flowchart 800 of processing that may be performed in an embodiment in accordance with techniques herein. The flowchart 800 summarizes processing as described above that may be performed in an embodiment in which there is not a sufficient number of available registers to store all desired counters simultaneously during entropy computation processing. Steps 806, 808, 810, 812, 814 and 816 of FIG. 8 are respectively similar to steps 706, 708, 710, 712, 714 and 716 of FIG. 7. At step 802, the data layout for the configuration of counters as stored in registers and also in memory is determined. As described above, step 802 may include selecting a portion of the counters for storage in registers and storing the remaining portion of counters in memory. For those counters stored in registers, the data layout may map particular counters for different possible data items, symbols or data values into particular registers consistent with discussion above and such as illustrated in FIG. 6. From step 802, control proceeds to step 804 where the registers and memory locations including the counters may be initialized, such as initializing all counters to zero (0). From step 804, control proceeds to step 806 where processing commences, such as in connection with entropy computation, for a current chunk. In step 806, the next byte of the current chunk is read. From step 806, control proceeds to step 808 where the numeric value of the byte just read in step 806 is determined. For example, the numeric value is one of the possible 256 data values in 320b of FIG. 3. From step 808, control proceeds to step 809 to determine whether the counter for the numeric value determined in step 808 is stored in memory or stored in one of the registers. If step 809 evaluates to yes, control proceeds to step 810. In step 810, processing determines the particular register, and location therein, configured to store the counter associated with the numeric value of the byte. From step 810, control proceeds to step 812 where the counter associated with the numeric value (e.g., determined in step 708) of the byte is updated, such as by incrementing the counter by one. Step 812 includes updating the counter value as stored in the particular register based on the data layout. Thus, step 812 involves incrementing the counter value associated with numeric value of the byte, where the counter value is stored in a register. No memory access is performed to obtain or store the counter value being updated in step 812. From step 812, control proceeds to step 814. If step 809 evaluates to no, it means that the current counter value for the numeric value determined in step 808 is stored in memory and control proceeds to step 813. At step 813, processing is performed to read the current counter value from memory, update the counter such as increment the counter by 1, and then store the updated counter value in memory. Step 813 includes processing performed in what is referred to elsewhere herein as the traditional access pattern or instruction template for accessing and incrementing a counter value stored in memory. From step 813, control proceeds to step 814.

At step 814, a determination is made as to whether processing is complete for the current chunk. If step 814 evaluates to no, control proceeds to step 806 to process the next byte of the current chunk. If step 814 evaluates to yes, control proceeds to step 816. Step 816 may include performing any remaining entropy computation processing needed to determine the entropy value for the current chunk. Consistent with other discussion herein, the entropy value may be determined using the counters of the frequencies of the different 256 possible numeric values for bytes of the chunk. Such counters may be used, for example, in calculating the entropy value for the chunk based on EQUATION 1 and EQUATION 2 as described herein. Although not specifically included in FIG. 8, the entropy value for the chunk may be used as described elsewhere herein, such as in connection with FIG. 5 processing to determine whether the chunk is compressible or uncompressible. In particular, the flowchart 800 processing may be performed as part of processing of step 502 of FIG. 5. It should be noted that steps 806, 808, 809, 810, 812, 813, 814 and 816 describe processing performed for a single chunk such as a single instance of an 8 KB chunk 310 of a data set. Generally, such processing may be repeated for each desired chunk of the data set for which an entropy value may be determined.

In connection with an embodiment performing the steps of FIG. 8, any suitable technique may be used to determine which counters are in memory and which counters are in the registers. In at least one embodiment, the particular counters stored in the registers and the particular counters stored in memory may change as different counters are accessed during processing of the steps of FIG. 8. For example, an embodiment may use an optimization such as least recently used to determine the particular counters stored in memory and the registers. For example, if a counter is stored in memory at a first point in time and accessed more than once (or another specified threshold number of times), the data layout may be dynamically modified whereby that particular counter referenced more than once is now stored in a register rather than memory. In order to store the counter that is accessed more than once in a register, a different counter currently stored in a register is evicted. The particular counter evicted from the register may be, for example, the least recently used counter (e.g., counter that has not been accessed for the longest period of time of all counters stored in registers). As another variation, the particular counter evicted from the register may be, for example, the counter accessed the least number of times within a specified time period (with respect to all counters stored in registers).

Figure 9:
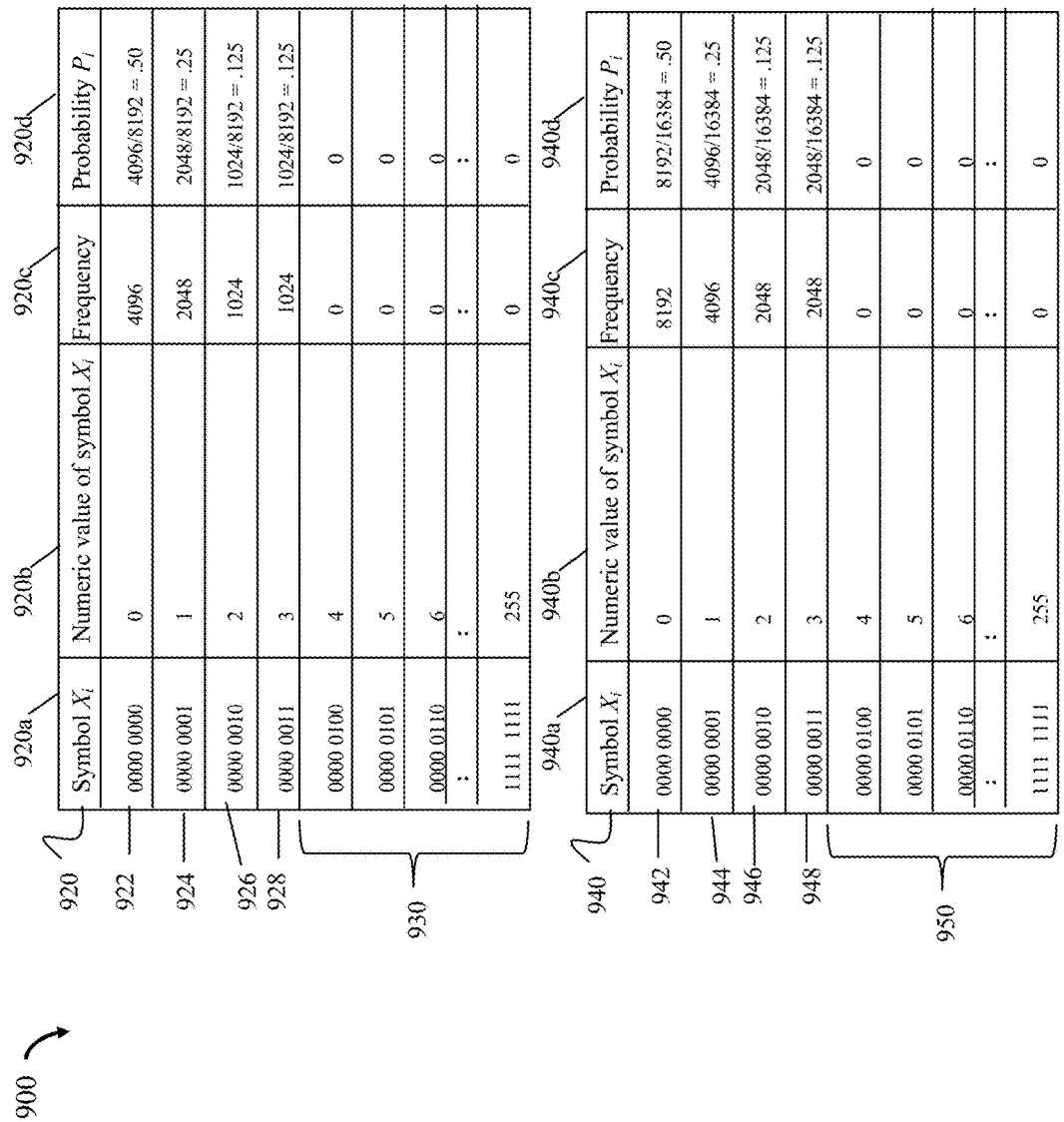
FIG. 9 is an example illustrating tables of information that may be used in an embodiment in accordance with techniques herein.

FIG. 8 processing provides for storing a portion of counters in registers and a remaining portion of the counters in memory where such partitioning regarding what counters are stored in registers and memory is not modified. However, as also discussed above, probabilistic information (e.g., such as based on historical information) regarding the probability of occurrence of the different symbols (320a), data items or values (320b) may be used to select the particular counters associated with particular symbols, data items or values that are stored in the registers rather than in memory. In such an embodiment, step 802 processing of FIG. 8 may further include ranking the possible symbols (320a), data items or values (320b), from highest to lowest probability of occurrence, and packing into the registers the counters associated with those symbols, data items or value having the highest ranked probability of occurrence. Additionally, such an embodiment as also discussed above may provide for maintaining and updating the probabilistic information. The probabilistic information indicating the probability of occurrence of each of the different symbols (320a), data items or values (320b) may be a cumulative probability such as based on the cumulative observed frequencies of the different symbols (320a), data items or values (320b) across multiple chunks of the same data set. In such an embodiment, step 816 of FIG. 8 may also include additional processing to update the probabilistic information based on the particular frequencies 320c observed for the current chunk of the data set just processed. In this manner, the probabilistic information for a data set may be based on the cumulative observed frequencies 320c across multiple chunks of the data set. Step 816 may include, for example, adding the frequencies 320c for the current data chunk to an existing set of cumulative frequencies also maintained for each of the symbols (320a), data items or values (320b). Such cumulative frequencies and associated cumulative probabilities included in the probabilistic information may be stored in a table stored in memory. For example, referring to FIG. 9, shown is an example 900 including a table of probabilistic information 920 for a data set. The table 920 includes columns and rows of information similar to those as described in connection with FIG. 3. In particular, the table 920 may illustrate the probabilistic information of cumulative frequencies 920c and associated probabilities 920d after processing a single chunk of a data set. The table 920 may denote a first instance of the table stored in memory after processing a first 8 KB chunk. Subsequently, a second chunk 8 KB of the data set is processed and table 940 may represents an updated version of the probabilistic information from table 920 after processing the second chunk. In this particular example, the first chunk and second chunk may include the same frequencies of symbols. In a similar manner, after processing a third chunk, such frequencies of the different symbols (940a) and numeric values (940b) observed for the third chunk may be added to those existing cumulative frequencies in 940c and the cumulative probabilities 940d may also be accordingly updated (e.g., where the denominators of 940d are now 8192*3=24576—total bytes in the 3 chunks processed of the data set). Thus, step 716 of FIG. 8 may include updating this in-memory table of probabilistic information that may be maintained to reflect cumulative frequencies and probabilities for a data set.

When processing each next chunk of the data set, step 802 may use a current set of the cumulative frequencies and probabilities of the probabilistic information (e.g., 940) to rank the possible symbols, data items or values, from highest to lowest probability of occurrence, and packing into the registers the counters associated with those symbols, data items or value having the highest ranked probabilities of occurrence.

The above describes embodiments in accordance with techniques herein. In a first case described above, all counters are stored in the registers for entropy computation. As a variation, if there is an insufficient number of available registers to store all counters for entropy computation, a portion of the counters may be stored in the registers and a remaining portion may be stored in memory for use during entropy computation. As yet another variation, an embodiment in accordance with techniques herein may also further partition the data set or stream into smaller portions or chunks processed in "runs" or "passes" (e.g., in which each smaller portion or chunk is processed in a different run or pass). Generally, the size of the smaller portion or chunk is selected based on the size/number of bits of the counter and the maximum frequency or value that can be represented by such a counter. The counter size is selected small enough so that there are a sufficient number of registers available to store counters for all the desired symbols (320*a*), data items or values (320*b*). For example, assume there are only 4 512 bit-wide registers available for storing the 256 counters 320*c* for the possible 256 symbols 320*a* or data values 320*b*. In this case, in order to configure all 256 counters simultaneously into the same data layout of the 4 512 bit-wide registers, each counter must use no more than 8 bits, or 1 byte, each. The maximum value or frequency that can be represented by each counter is 255. Thus, 255 symbols, data items or values may be processed in a single "pass". In this case, with reference back to FIG. 3, the original 8 KB data chunk of 8192 bytes is further partitioned into smaller portions each having a size of 255 bytes, whereby each pass processes 255 bytes (or no more than 255 bytes) and where there are a sufficient number of registers available to store all 256 8-bit counters in registers simultaneously during entropy computation. In this example using 8-bit counters, an "in memory" backing set of cumulative counters for the larger original 8 KB chunk may be utilized. Each of the cumulative counters may be sized appropriately for the maximum expected data item frequency for the original 8 KB chunk. Each time a single "run" or "pass" of 255 items is processed, processing refreshes by updating the in-memory backing set of cumulative counters (e.g., "grand totals" bucket array) for the larger original 8 KB chunk to also include the current counter values stored in the registers for the just completed single run or pass. The only in-memory cumulative counters that need to updated are those having corresponding in-register counters that are non-zero. The refresh operation includes adding each in-register counter value to its corresponding in-memory cumulative counter and then zeroing out the in-register counter at the end of each "run" in preparation for the next pass or run. This refresh to update the cumulative counters occurs much less frequently than the load and store pattern of the traditional access pattern or instruction template (such as described elsewhere herein) typically associated with a memory based implementation in which all counters are stored in memory and accordingly updated and then once again stored in memory.

Figure 10:
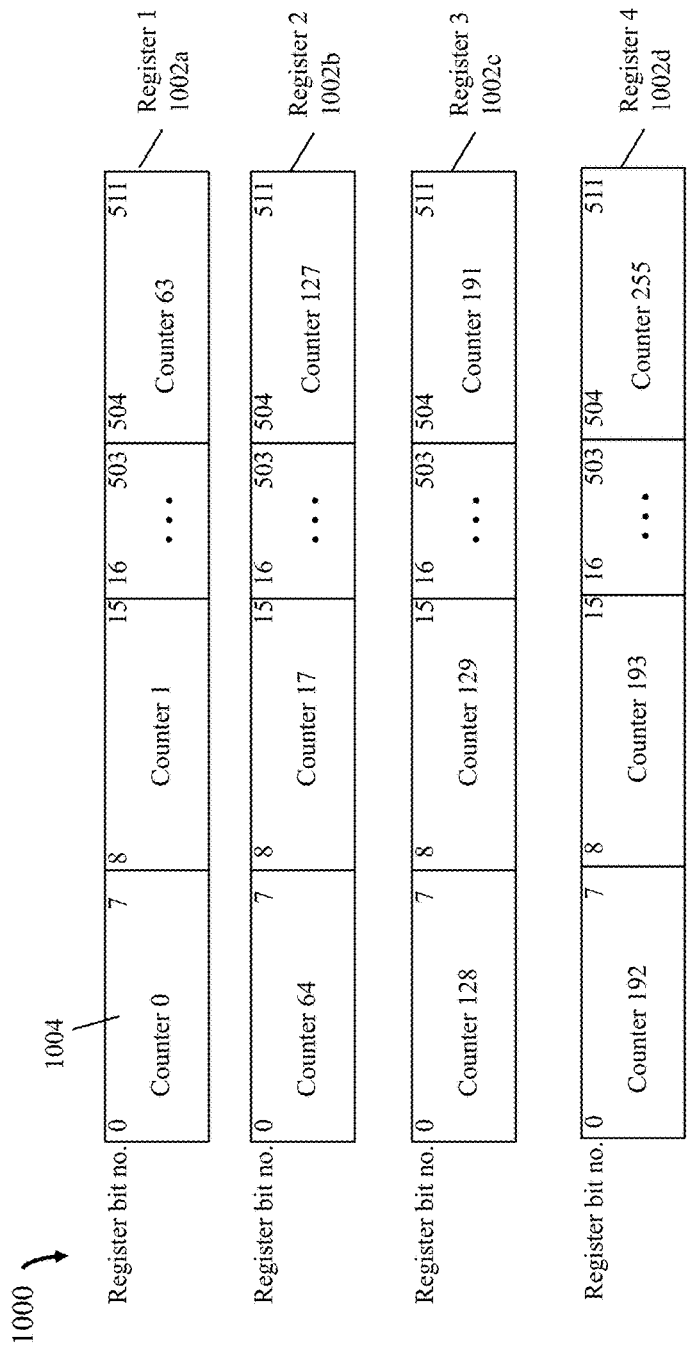

To further illustrate the refresh and use of register-based counters and cumulative counters stored in memory, reference is made to FIG. 10 and also back to FIG. 3. The cumulative in-memory set of counters and associated probabilities that may be maintained for an 8 KB chunk may be denoted by the 256 frequencies or counters in column 320*c* of table 320 of FIG. 3. Although FIG. 3 includes non-zero in-memory cumulative counter values in column 320*c*, initially all frequencies or counters 320*c* and probabilities 320*d* of FIG. 3 may be set to 0. A data layout of the 4, 512 bit wide registers is determined for the 256, 8-bit counters such as illustrated in FIG. 10. The example 1000 includes the 4 512 bit wide registers 1002*a-d* each configured to store a different set of 64, 8 bit counters. Each of the counters stored in one of the registers 1002*a-d* has a corresponding cumulative counter included in the cumulative in-memory set of counters of column 320*c* in the table 320 of FIG. 3. Each of the numeric values "i" (e.g., an entry from column 320*b* of FIG. 3) of a symbol or data item (e.g., an entry from column 320*a* of FIG. 3) has an associated counter "i" in one of the registers 1002*a-d* of FIG. 10, where "i" is an integer in the inclusive range from 0 to 255. For example, counter 0 (1004) of register 1 1002*a* of FIG. 10, corresponding to the symbol 322*a* or 8-bit pattern of 8 zeroes, having a numeric value of 0 322*b*, has a corresponding cumulative in-memory frequency or counter denoted by the entry 322*c* of column 320*c*. As mentioned above, initially, all cumulative counters or frequencies of the column 320*c* of FIG. 3 may be zero. Subsequently, a first pass of the 255 data items or bytes is completed. As a result of processing the 255 data items or bytes of the first pass, the in-register counters of 1000 may be accordingly updated based on the particular numeric values (320*b*) of the 255 data items processed in the first pass. Thus, after the first pass of 255 data items, the in-register counters of 1000 reflect the observed frequencies of the different corresponding values (320*b*) of the 255 data items. Subsequently, after the first pass of 255 data items, the cumulative counters 320*c* may be accordingly updated by adding the current counter values of the in-register counters of 1000 to corresponding cumulative counters 320*c*. The particular frequency or counter values in column 322*c* may denote the cumulative in-memory frequencies or counters after performing many multiple such passes. For example, table 320 denotes a state of the cumulative frequencies and counters 320*c* at a point in time after performing multiple passes, such as after N passes. Assume the next 255 data items processing in the next pass N+1 each have the same 8-bit pattern of all zeroes 322*a* and each have a numeric value of 0 322*b*. As a result of performing the next pass, N+1, for such next 255 data items all having a data value of zero, counter 0 1004 of FIG. 10 may be 255 with all other counters of 1000 of FIG. 10 being zero. Subsequently, the frequency of 255, as stored in the 0-counter 1004 for the current pass N+1, is added to its corresponding cumulative in-memory counter 322*c*, having a current values of 4096 where 322*c* is updated after pass N+1 to be 4351.

Figure 11:
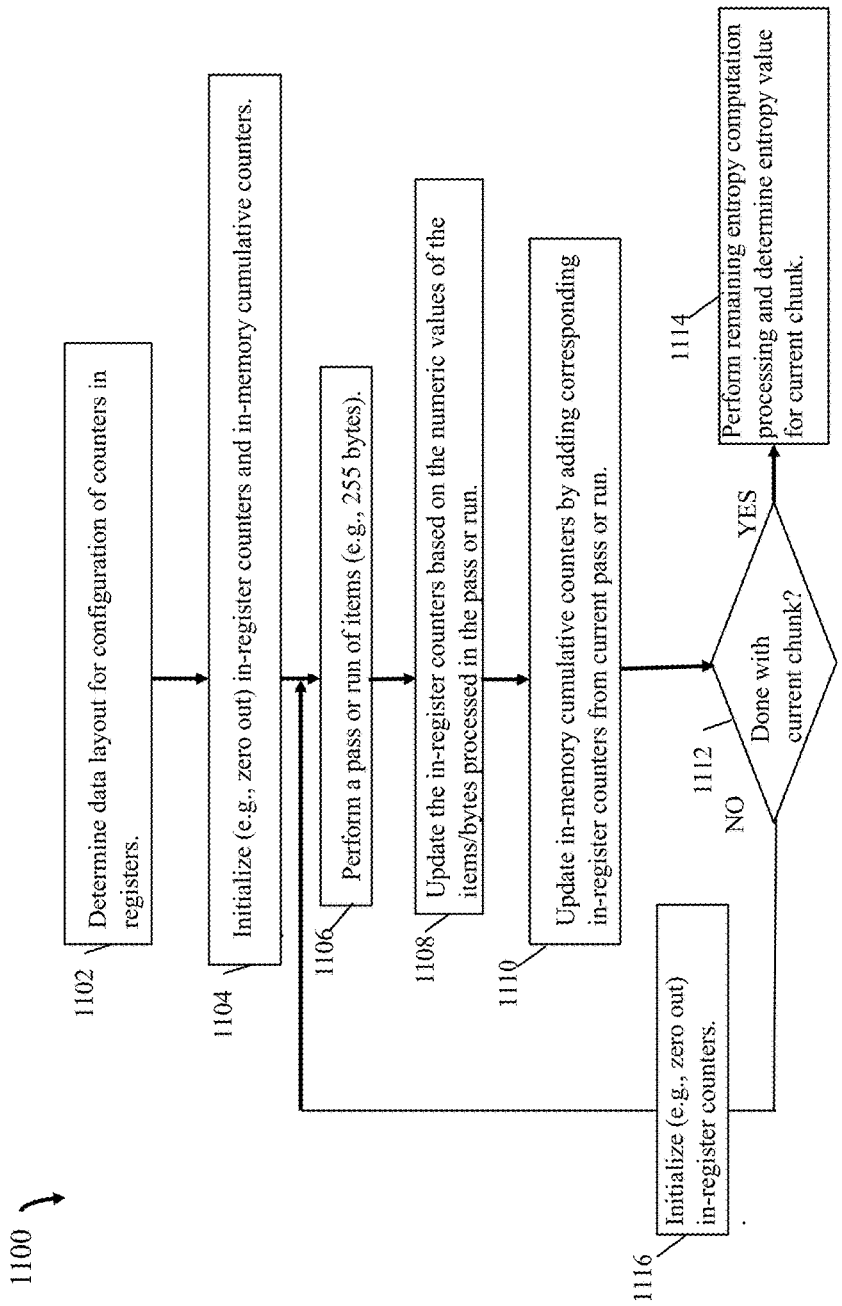

Referring to FIG. 11, shown is a flowchart of processing steps that may be performed in an embodiment in accordance with techniques herein. The flowchart 1100 summarizes processing described above where a larger original data chunk, such as an 8 KB or 8192 byte chunk is further partitioned into a number of smaller portions denoting a number of items or bytes processed in each single pass or run. Using such processing of the flowchart 1100, a complete set of counters is maintained in the registers where the maximum frequency value that can be represented by a counter (based on the size or number of bits per counter) denotes the maximum number of items processed in each pass. After processing items in each pass, a set of in-memory cumulative counters for the larger data chunk is updated by adding the non-zero in-register counters to corresponding in-memory cumulative counters maintained across the multiple passes or runs of items for the larger data chunk. At step 1102, the data layout for the configuration of counters stored in the registers is determined. For example, step 1102 may include determining a data layout of all counter values in available registers such as described in connection with FIG. 10. From step 1102, control proceeds to step 1104. In step 1104, processing is performed to initialize (e.g., zero out) the 256 in-register counters such as illustrated in FIG. 10 and also to initialize the corresponding in-memory cumulative counters maintained for the larger 8 KB data chunk for which an entropy value is being determined. From step 1104, control proceeds to step 1106 where a pass or run of data items is processed. As described herein the number of data items processing in a single run in this example may be 255 which is that maximum frequency or counter value that can be represented by each of the 256 counters. In this case, each counter is 8 bits having a maximum possible value of 255, the number of items in the pass or run processed in step 1106. From step 1106, control proceeds to step 1108. In step 1108, the in-register counters are updated based on the numeric values of the items (e.g., bytes) processed in the run or pass. After step 1108, the in-register counters denote the count of the number of times each of the possible data items or values occurred in the 255 data items processed in the run. From step 1108, control proceeds to step 1110. In step 1110, processing is performed to update the in-memory cumulative counters by adding the corresponding in-register counters from the current pass or run. As described herein, each of the in-register counters has a corresponding in-memory cumulative counter maintained for the larger 8 KB data chunk. In-register counters are updated based on each next set of items processed in a next pass or run in step 1108. In step 1110, each non-zero in-register counter is added to the current value of a corresponding in-memory cumulative counter. In this example, the in-register counter and corresponding in-memory counter have the same index "i", where "i" denotes the numeric value of the associated data item for such counters. From step 1110, control proceeds to step 1112 where a determination is made as to whether processing for the current 8 KB chunk is completed. If step 1112 evaluates to yes, control proceeds to step 1114 to perform any remaining entropy computation processing and determine the entropy value for the current chunk using the in-memory cumulative counters and associated probabilities. Step 1114 is similar to processing described elsewhere herein, such as in connection with step 716 of FIGS. 7 and 8. If step 1112 evaluates to no, control proceeds to step 1116 where the in-register counters are reinitialized to zero for use with the next pass or run of data items of the current chunk. From step 1116, control proceeds to step 1106.

As described herein, CPUs may utilize a hierarchical set of on-chip caches, each tier being faster than the next lower tier. For example, as discussed elsewhere herein, CPUs may have multiple caching levels such as L1, L2 and L3 cache levels. In one aspect, techniques herein may be characterized as effectively further extending the CPU caching hierarchy by using the CPU register space as an "extra level" of fast caching where the CPU register space may be characterized as the caching level having the fastest access time with respect to all caching levels or layer in the hierarchy.

The techniques herein may be implemented using any suitable hardware and/or software, such as executing code using a processor where the code is stored on any one or more different forms of computer-readable media. Computer-readable media may include different forms of volatile (e.g., RAM) and non-volatile (e.g., ROM, flash memory, magnetic or optical disks, or tape) storage which may be removable or non-removable. The processor may be any suitable processor such as, for example, a processor of a computer, data storage system, or other component, such as an ASIC (application specified integrated circuit).

While the invention has been disclosed in connection with embodiments shown and described in detail, their modifications and improvements thereon will become readily apparent to those skilled in the art. Accordingly, the spirit and scope of the present invention should be limited only by the following claims.

What is claimed is:

1. A method of data processing comprising:
   determining a data layout for a configuration of a plurality of counters stored in a plurality of registers, wherein each of the plurality of registers is configured to store at least two of the plurality of counters, wherein a first portion of data items allowable in a data set are mapped to the plurality of counters, wherein each of the plurality of counters is associated with a particular data item of the first portion of data items allowable in the data set and denotes a current frequency of the particular data item;
   receiving a plurality of data items of a data chunk of the data set;
   for each data item of the plurality of data items, performing processing including:
      determining a first of the plurality of counters corresponding to said each data item, wherein the first counter is stored in a first of the plurality of registers and denotes a current frequency of said each data item in the first plurality of data items; and
      incrementing the first counter stored in the first register by one; and
   determining, in accordance with the plurality of counters stored in the plurality of registers, an entropy value for the data chunk.

2. The method of claim 1, wherein the plurality of counters are not stored in memory and are only stored in the plurality of registers.

3. The method of claim 1, wherein each of the plurality of counters is associated with a different data item of the first portion of data items allowable in the data set and each of the plurality of counters is implemented as a data type having a size of a number of bits capable of representing a range of defined frequency values, wherein the range includes a maximum number of potential occurrences of the different data item allowable in the data chunk.

4. The method of claim 1, wherein a second plurality of counters are stored in memory and associated with a second portion of data items allowable in the data set, and wherein each of the second plurality of counters is associated with a particular data item of the second portion of data items allowable in the data set and denotes a current frequency of the particular data item.

5. The method of claim 4, further comprising:
   ranking an aggregate set of data items allowable in the data set, wherein said ranking is performed in accordance with probabilities that data items of the aggregate set are expected to occur in the data set, wherein said aggregate set includes the first portion of data items allowable in the data set and includes the second portion of data items allowable in the data set;
   selecting the first portion of data items allowable in the data set for storage in the plurality of registers, wherein the first portion of data items are ranked by said ranking as having highest associated probabilities of expected occurrence in the data set; and selecting the second portion of data items allowable in the data chunk for storage in memory, where the second portion of data items are ranked by said ranking as having associated probabilities of expected occurrence in the data set which are less than probabilities of expected occurrence in the data set associated with the first portion of data items allowable in the data set.

6. The method of claim 1, wherein the plurality of data items received in said receiving are data items processed in a single pass, wherein a number of data items in the plurality of data items is selected in accordance with a maximum counter value representable by each of the plurality of counters stored in the plurality of registers.

7. The method of claim 6, wherein after performing the processing for the plurality of data items of the single pass, the method includes performing other processing including:
updating in-memory cumulative counter values for the data chunk in accordance with the plurality of counters stored in the plurality of registers, wherein each of the plurality of counters stored in one of the plurality of registers has a corresponding one of the in-memory cumulative counter values and said updating adds said each counter stored in the one register to the corresponding one of the in-memory cumulative counter values.

8. The method of claim 7, further comprising:
receiving a second plurality of data items of the data chunk processed in a second single pass, wherein a number of data items in the second plurality of data items is selected in accordance with the maximum counter value representable by each of the plurality of counters stored in the plurality of registers.

9. The method of claim 8, further comprising:
for each data item of the second plurality of data items, performing second processing including:
determining one of the plurality of counters corresponding to said each data item, wherein the one counter is stored in a second of the plurality of registers and denotes a current frequency of said each data item in the second plurality of data items; and
incrementing the one counter stored in the second register by one; and
updating the in-memory cumulative counter values for the data chunk in accordance with the plurality of counters stored in the plurality of registers after completing the second processing for the second plurality of data items, wherein said updating after completing the second processing adds the plurality of counters stored in the plurality of registers to corresponding ones of the in-memory cumulative counter values.

10. The method of claim 9, wherein said determining an entropy value for the data chunk uses the in-memory cumulative counter values for the data chunk.

11. The method of claim 1, wherein the entropy value for the data chunk is determined inline as part of I/O path processing for the data chunk.

12. The method of claim 11, further comprising:
determining, in accordance with the entropy value for the data chunk, whether to compress the data chunk.

13. The method of claim 12, further comprising:
determining whether the entropy value for the data chunk is greater than an entropy threshold;

responsive to determining that the entropy value for the data chunk is greater than the entropy threshold, determining that the data chunk is uncompressible and not to compress the data chunk, wherein the data chunk is stored in its original uncompressed form; and responsive to determining that the entropy value for the data chunk is equal to or less than the entropy threshold, compressing the data chunk.

14. The method of claim 13, wherein subsequent to said compressing the data chunk, the method includes:
determining whether a compressed form of the data chunk, as compared to an original uncompressed form of the data chunk, achieves at least a threshold level of data reduction;
responsive to determining the compressed form of the data chunk achieves at least a threshold level of data reduction, determining the data chunk is compressible and storing the data chunk in the compressed form; and
responsive to determining the compressed form of the data chunk does not achieve at least a threshold level of data reduction, determining the data chunk is uncompressible and storing the data chunk in its uncompressed form.

15. A system comprising:
at least one processor; and
at least one memory comprising code stored thereon that, when executed, performs a method of data processing comprising:
determining a data layout for a configuration of a plurality of counters stored in a plurality of registers, wherein each of the plurality of registers is configured to store at least two of the plurality of counters, wherein a first portion of data items allowable in a data set are mapped to the plurality of counters, wherein each of the plurality of counters is associated with a particular data item of the first portion of data items allowable in the data set and denotes a current frequency of the particular data item;
receiving a plurality of data items of a data chunk of the data set;
for each data item of the plurality of data items, performing processing including:
determining a first of the plurality of counters corresponding to said each data item, wherein the first counter is stored in a first of the plurality of registers and denotes a current frequency of said each data item in the first plurality of data items; and
incrementing the first counter stored in the first register by one; and
determining, in accordance with the plurality of counters stored in the plurality of registers, an entropy value for the data chunk.

16. A non-transitory computer readable medium comprising code stored thereon that, when executed, performs a method of data processing comprising:
determining a data layout for a configuration of a plurality of counters stored in a plurality of registers, wherein each of the plurality of registers is configured to store at least two of the plurality of counters, wherein a first portion of data items allowable in a data set are mapped to the plurality of counters, wherein each of the plurality of counters is associated with a particular data item of the first portion of data items allowable in the data set and denotes a current frequency of the particular data item;

receiving a plurality of data items of a data chunk of the data set;

for each data item of the plurality of data items, performing processing including:
- determining a first of the plurality of counters corresponding to said each data item, wherein the first counter is stored in a first of the plurality of registers and denotes a current frequency of said each data item in the first plurality of data items; and
- incrementing the first counter stored in the first register by one; and determining, in accordance with the plurality of counters stored in the plurality of registers, an entropy value for the data chunk.

17. The non-transitory computer readable medium of claim 16, wherein the plurality of counters are not stored in memory and are only stored in the plurality of registers.

18. The non-transitory computer readable medium of claim 16, wherein each of the plurality of counters is associated with a different data item of the first portion of data items allowable in the data set and each of the plurality of counters is implemented as a data type having a size of a number of bits capable of representing a range of defined frequency values, wherein the range includes a maximum number of potential occurrences of the different data item allowable in the data chunk.

19. The non-transitory computer readable medium of claim 16, wherein a second plurality of counters are stored in memory and associated with a second portion of data items allowable in the data set, and wherein each of the second plurality of counters is associated with a particular data item of the second portion of data items allowable in the data set and denotes a current frequency of the particular data item.

20. The non-transitory computer readable medium of claim 19, wherein the method further comprises:
- ranking an aggregate set of data items allowable in the data set, wherein said ranking is performed in accordance with probabilities that data items of the aggregate set are expected to occur in the data set, wherein said aggregate set includes the first portion of data items allowable in the data set and includes the second portion of data items allowable in the data set;
- selecting the first portion of data items allowable in the data set for storage in the plurality of registers, wherein the first portion of data items are ranked by said ranking as having highest associated probabilities of expected occurrence in the data set; and
- selecting the second portion of data items allowable in the data chunk for storage in memory, where the second portion of data items are ranked by said ranking as having associated probabilities of expected occurrence in the data set which are less than probabilities of expected occurrence in the data set associated with the first portion of data items allowable in the data set.

* * * * *